(12) United States Patent
Dutta

(10) Patent No.: US 8,611,157 B2
(45) Date of Patent: Dec. 17, 2013

(54) PROGRAM TEMPERATURE DEPENDENT READ

(75) Inventor: Deepanshu Dutta, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 48 days.

(21) Appl. No.: 13/335,524

(22) Filed: Dec. 22, 2011

(65) Prior Publication Data

US 2013/0163342 A1  Jun. 27, 2013

(51) Int. Cl.
   *G11C 11/34* (2006.01)
(52) U.S. Cl.
   USPC ............................ 365/185.21; 365/185.24
(58) Field of Classification Search
   USPC ........................... 365/185.21, 185.24
   See application file for complete search history.

(56) References Cited

U.S. PATENT DOCUMENTS

| | | | |
|---|---|---|---|
| 6,560,152 B1 | 5/2003 | Cernea | |
| 6,801,454 B2 | 10/2004 | Wang et al. | |
| 7,057,958 B2 | 6/2006 | So et al. | |
| 7,257,028 B2 | 8/2007 | Lee et al. | |
| 7,345,913 B2 | 3/2008 | Isobe | |
| 7,460,407 B2 | 12/2008 | Mokhlesi et al. | |
| 7,755,946 B2 | 7/2010 | Dunga et al. | |
| 2002/0109539 A1* | 8/2002 | Takeuchi et al. | 327/513 |
| 2007/0291566 A1* | 12/2007 | Mokhlesi et al. | 365/212 |
| 2008/0158992 A1* | 7/2008 | Sekar et al. | 365/185.22 |
| 2008/0247253 A1 | 10/2008 | Nguyen et al. | |
| 2009/0097319 A1* | 4/2009 | Sekar et al. | 365/185.17 |
| 2009/0290428 A1 | 11/2009 | Noh | |
| 2010/0073069 A1 | 3/2010 | Wang et al. | |
| 2010/0329026 A1 | 12/2010 | Nakamura et al. | |
| 2011/0205823 A1* | 8/2011 | Hemink et al. | 365/211 |

* cited by examiner

*Primary Examiner* — Michael Tran
(74) *Attorney, Agent, or Firm* — Vierra Magen Marcus LLP

(57) ABSTRACT

Methods and non-volatile storage systems are provided for using compensation that depends on the temperature at which the memory cells were programmed. Note that the read level compensation may have a component that is not dependent on the memory cells' Tco. That is, the component is not necessarily based on the temperature dependence of the Vth of the memory cells. The compensation may have a component that is dependent on the difference in width of individual Vth distributions of the different states across different temperatures of program verify. This compensation may be used for both verify and read, although a different amount of compensation may be used during read than during verify.

22 Claims, 18 Drawing Sheets

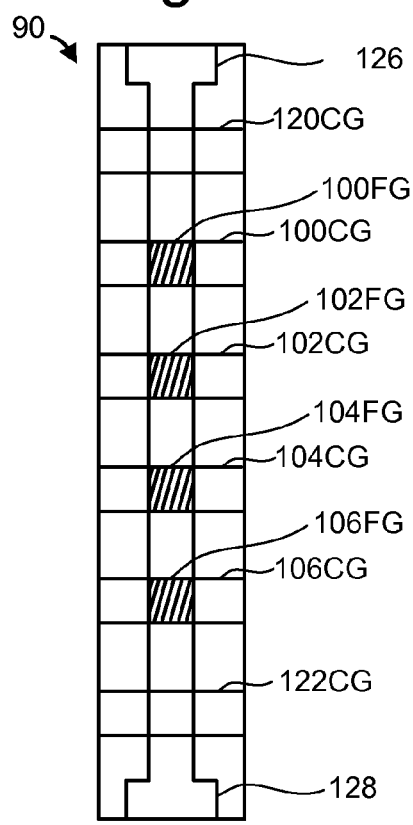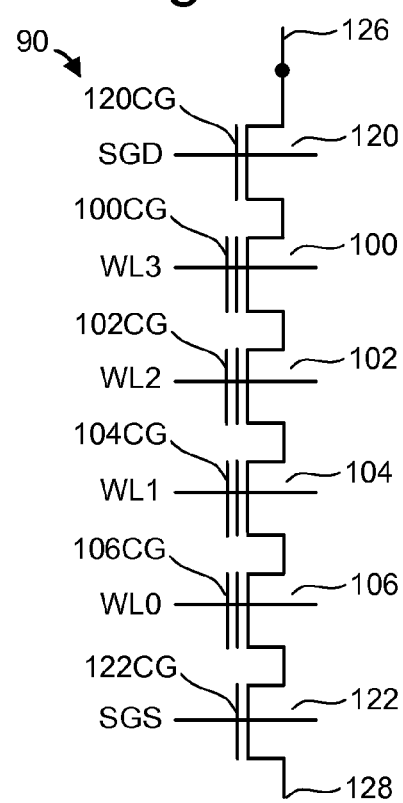

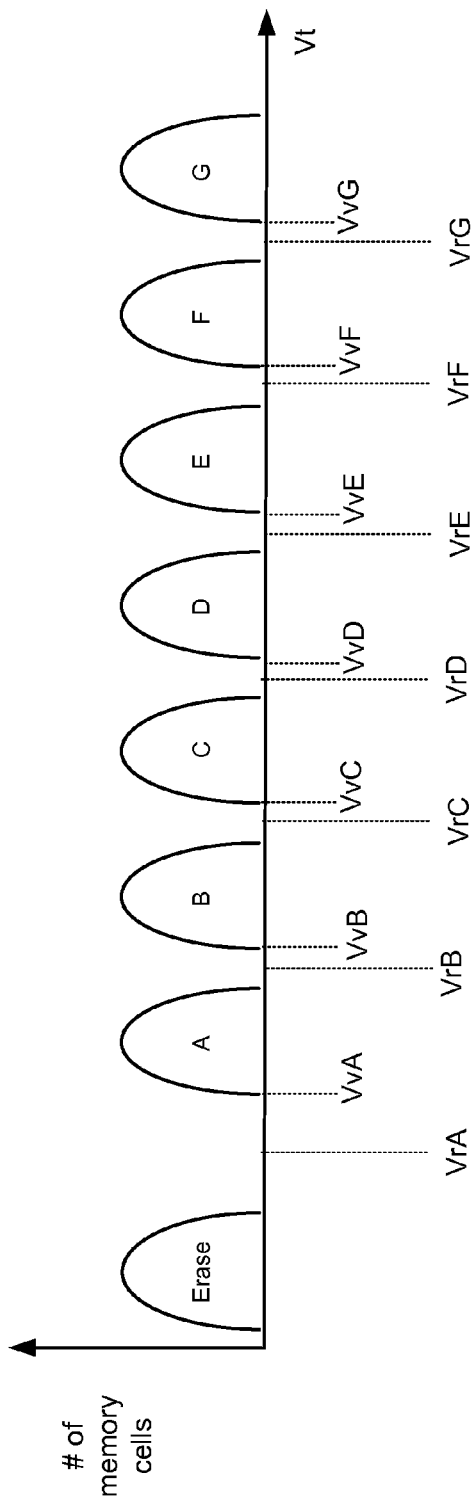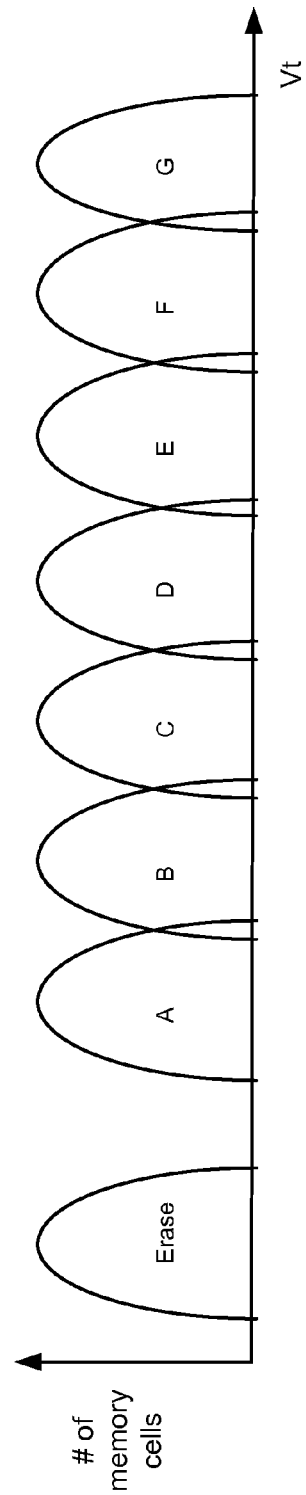
Fig. 6A
Fig. 6B

PROGRAM TEMPERATURE DEPENDENT READ

BACKGROUND

The present disclosure relates to technology for non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM. The array of storage elements may be divided into a large number of blocks of storage elements.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate. Thus, a storage element may be read by applying a reference voltage to its control gate and sensing the magnitude of the current that flows between its drain and source.

A storage element may be programmed by applying suitable programming voltages to its control gate. Typically, a program voltage Vpgm applied to the control gate during a program operation is applied as a series of pulses that increase in magnitude over time.

Typically, the Vth of the memory cell varies with temperature. If the same memory cell is read at different temperatures, its Vth typically shifts lower as the temperature increases. The Vth shift per temperature unit is defined as the Temperature Coefficient (or simply Tco) for that memory cell. For some devices, Tco is a negative quantity since the Vth reduces as the temperature increases.

This shift is depicted in FIG. 1, which shows two sets of threshold voltage distributions. One set is for a high temperature read, the other for a low temperature read. However, each set was programmed at the same temperature. Each set has a threshold voltage distribution for an A-state, B-state, and C-state. A portion of the erase-state is also shown. The threshold voltage distribution for a given state shows the range of Vths for memory cells programmed to that state. Example read levels (VrA, VrB, VrC) are shown for the low temperature distributions. Example read levels (VrA', VrB', VrC') are shown for the high temperature distributions. For accurate reading, the read levels may be about midway between two adjacent threshold voltage distributions. Note that the y-axis is a log scale of the number of memory cells.

One possible way to compensate for this Vth temperature dependence is to determine read levels according to an equation such as Equation 1.

$$R(\text{at}T) = R0 + Tco * T \quad \text{Eq. 1}$$

In Equation 1, R is the read level for a given state, R0 is a base read reference voltage for that state, T is the temperature during read, and Tco is the temperature coefficient which may be optimized by matching it with the memory cell Tco. Note that Tco may be a function of the state being read. As one example, a result of applying Equation 1 may be to determine level VrB for the low-temperature read and VrB' for the high-temperature read (see FIG. 1). Thus, a compensation that is based on the dependence of the memory cell's Vth on temperature may be applied to the read levels.

Further complicating the situation is that the memory cells could be programmed at different temperatures. For example, memory cells in one block (or some other unit) in the memory could be programmed at a high temperature and another block at a low temperature. In one scenario, the different blocks may be read back at the same read temperature. For example, there may be a high-temperature program paired with a high-temperature read, as well as a low-temperature program paired with a high-temperature read. In another scenario, the different blocks may read back at different read temperatures. For example, there may be a high-temperature program paired with a high-temperature read, as well as a low-temperature program paired with a low-temperature read.

If the same program verify levels are used at different temperatures, it would lead to different Vth distribution positions for the blocks programmed at different temperatures due to the Tco of the memory cells. This is true even if both blocks are read at the same temperature. This is also true even if temperature compensation is used during read for the case that reading is performed at different temperatures. Thus, simply having a Tco on read levels is not sufficient to take care of different programming temperatures.

To resolve the problem of different programming temperatures, the same Tco may also be applied to all the verify levels (not depicted in FIG. 1). As one example, the verify levels will also follow Equation 1 (but with verify levels instead of read levels). At lower temperatures, the verify levels for all states will be higher than what they would be at higher temperature. Thus, if both blocks are read back with optimized voltage Tco, the Vth distributions would align at the same position no matter the temperature the programming was done at.

Note that to achieve the above, the value for Tco used on read/verify levels needs to be optimized such that it matches with the memory cell Tco (the rate at which typical cell's Vth moves with temperature). Also there may be state dependency in the memory cell Tco, which means different Tco values may be used to determine read and verify reference levels for different states.

BRIEF DESCRIPTION OF THE DRAWINGS

FIG. 2A is a top view of one embodiment of a NAND string.

FIG. 2B is an equivalent circuit diagram of the NAND string.

FIG. 6A depicts example threshold voltage distributions for states of memory cells in which there are eight states.

FIG. 6B depicts example threshold voltage distributions in which there is overlap.

DETAILED DESCRIPTION

Figure 1:
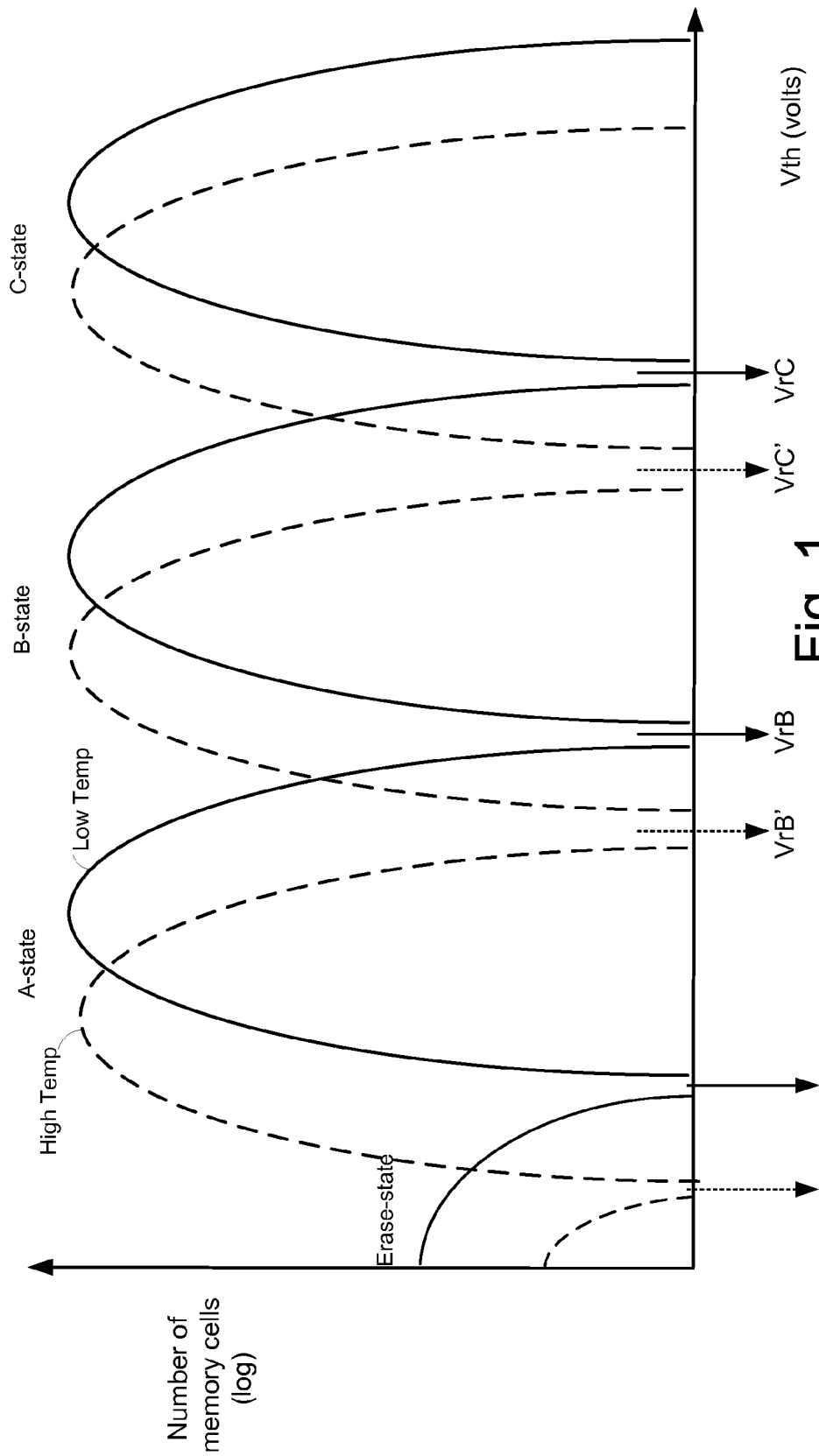
FIG. 1 shows threshold voltage distributions for different temperatures.

Methods and non-volatile storage systems are provided for programming and reading non-volatile storage. In one embodiment, memory cells are read using read levels (or read level compensation) that depend on the temperature at which the memory cells were programmed and verified. Note that in one embodiment the read level compensation has a component that is not dependent on the memory cells' Tco. That is, the component is not based on the temperature dependence of the Vth of the memory cells. In one embodiment, the sensing compensation has a component that is dependent on the temperature dependence of width of individual Vth distributions of the different states. This compensation may be used for both verify and read, although a different amount of compensation may be used during read than during verify.

Note that a Tco-scheme discussed in the background assumes that the Vth distribution widths of programmed states are independent of the temperature at which the data is programmed. Under this assumption, the Vth distributions at read align well for the cases when data is programmed at different temperatures and read back at same read temperature. However, in practice the Vth distribution widths may be temperature dependent.

One consequence of the temperature dependent Vth distribution widths is that optimum read levels at any given read temperature may depend on the program temperature. Thus, by saving the program temperature and using it to determine read levels, read errors may be reduced.

If the individual Vth distribution widths are temperature dependent, then the gaps between the individual Vth distribution for adjacent states may also vary with temperature. As one example, if the Vth distribution widths are wider with lower temperature, then the gaps between states may be larger with increasing temperature. In one embodiment, these gaps are reduced by providing temperature dependent verify reference levels. The total amount of gaps between all states may be referred to herein as a "threshold voltage distribution window." Thus, without compensation, this window may be larger for higher program temperatures. In one embodiment, programming at a low temperature is a worst case scenario because the window is smallest for the lowest operating temperature. The window at higher temperatures may not need to be this large to accurately read the memory cells. Therefore, the window may be reduced such that it is about the same size across a wide range of temperatures (although uniformity is not required). Stated another way, the window may be reduced for other than the worst case scenario, where the reduction depends on how much read margin (e.g., how much window) is desired. As will be discussed more fully below, shrinking the window at higher (and other) program temperatures may be used to help reduce total read errors.

Example Memory System and Operation

One example of a memory system suitable for implementing embodiments uses a NAND flash memory architecture, which includes connecting multiple transistors in series between two select gates. The transistors connected in series and the select gates are referred to as a NAND string. FIG. 2A is a top view showing one NAND string. FIG. 2B is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

Figure 2C:
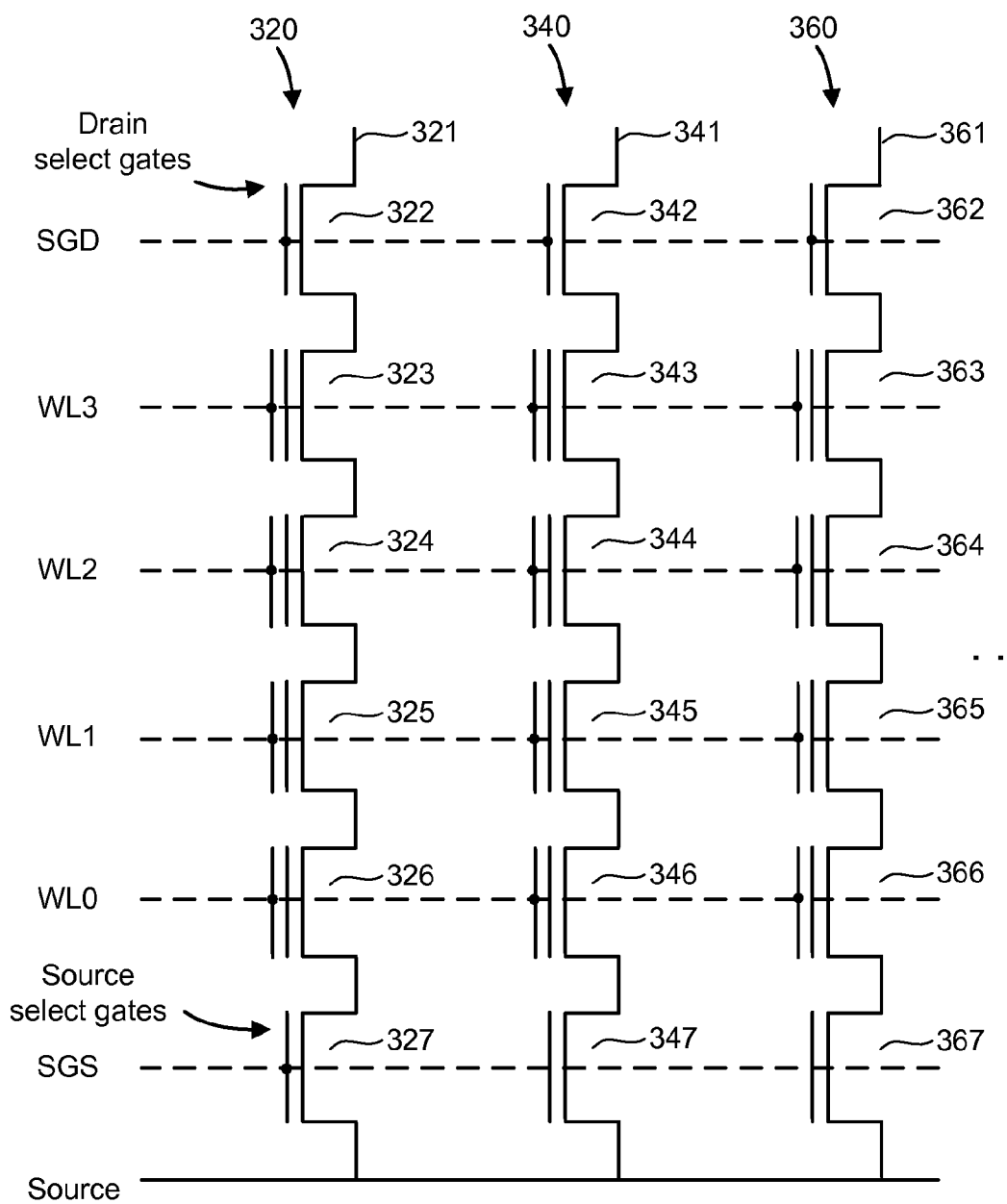
FIG. 2C is a circuit diagram depicting three NAND strings.

FIG. 2C is a circuit diagram depicting three NAND strings. A typical architecture for a flash memory system using a NAND structure will include many NAND strings. For example, three NAND strings 320, 340 and 360 are shown in a memory array having many more NAND strings. Each of the NAND strings includes two select gates and four storage elements. While four storage elements are illustrated for simplicity, NAND strings can have thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth. These select transistors are controlled by a drain select line SGD. In other embodiments, the select lines do not necessarily need to be in common among the NAND strings; that is, different select lines can be provided for different NAND strings. WL3 is connected to the control gates for storage elements 323, 343 and 363. WL2 is connected to the control gates for storage elements 324, 344 and 364. WL1 is connected to the control gates for storage elements 325, 345 and 365. WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, WL2 provides the control gates for storage elements 324, 344 and 364. In practice, there can be thousands of storage elements on a word line.

In some embodiments, the voltage applied to the bit line is greater than the voltage applied to source when reading a memory cell on the NAND string. In some embodiments, the voltage applied to the bit line is less than the voltage applied to source when reading a memory cell on the NAND string. For consistency of discussion, the source line will always be referred to as a source line regardless of whether the voltage applied to it is less than or greater than the voltage applied to the bit line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted at a suitable read level, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2C, the program voltage will also be applied to the control gates of storage elements 344 and 364.

Figure 3:
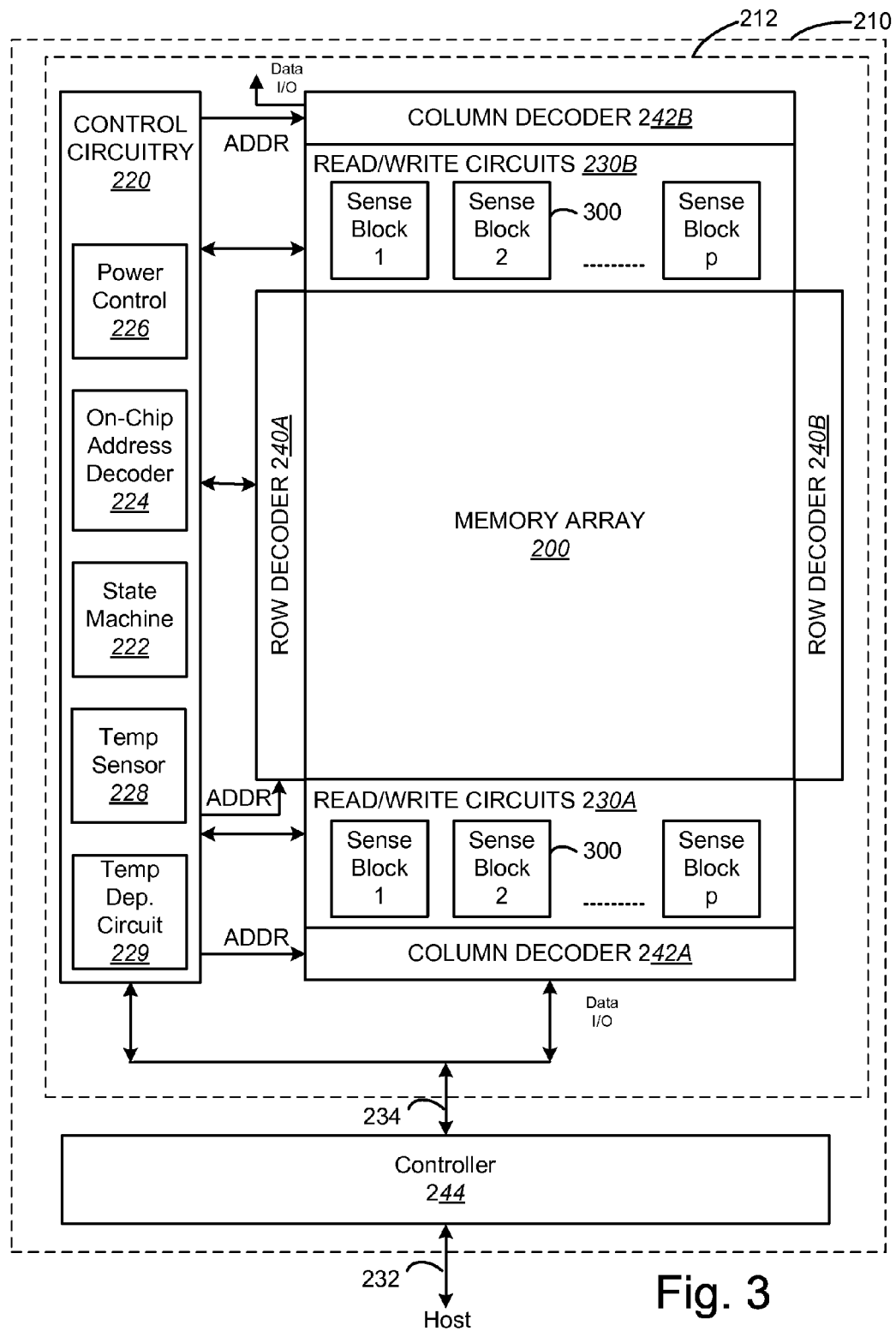
FIG. 3 illustrates a non-volatile storage device that may include one or more memory die or chips.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224, a power control module 226, a temperature sensor 228, and temperature dependent circuit 229. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

The temperature sensor 228 is able to sense and provide an indication of the present temperature. The temperature dependent circuit 229 is able to provide a signal that depends on the temperature. As one example, it might provide a reference voltage whose magnitude depends on temperature. Various techniques are known for providing temperature-compensated signals. One or more of these techniques can be used in the temperature-dependent circuit 229. Most of these techniques do not rely on obtaining an actual temperature measurement, although this approach is also possible. For example, U.S. Pat. No. 6,801,454, titled "Voltage Generation Circuitry Having Temperature Compensation," incorporated herein by reference, describes a voltage generation circuit which outputs read voltages to a non-volatile memory based on a temperature coefficient. The circuit uses a band gap current which includes a temperature-independent portion and a temperature-dependent portion which increases as temperature increases. Other techniques may be used. In one embodiment, the temperature-dependent circuit 229 outputs a signal that depends at least in part on temperature information that is provided to the temperature-dependent circuit 229. For example, temperature information may be stored during program verify, then used as input to the temperature-dependent circuit 229 during read. Thus, the temperature-dependent circuit 229 may provide a signal that depends, at least in part, on a temperature at a previous time. The signal may also depend, at least in part, on the present temperature.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
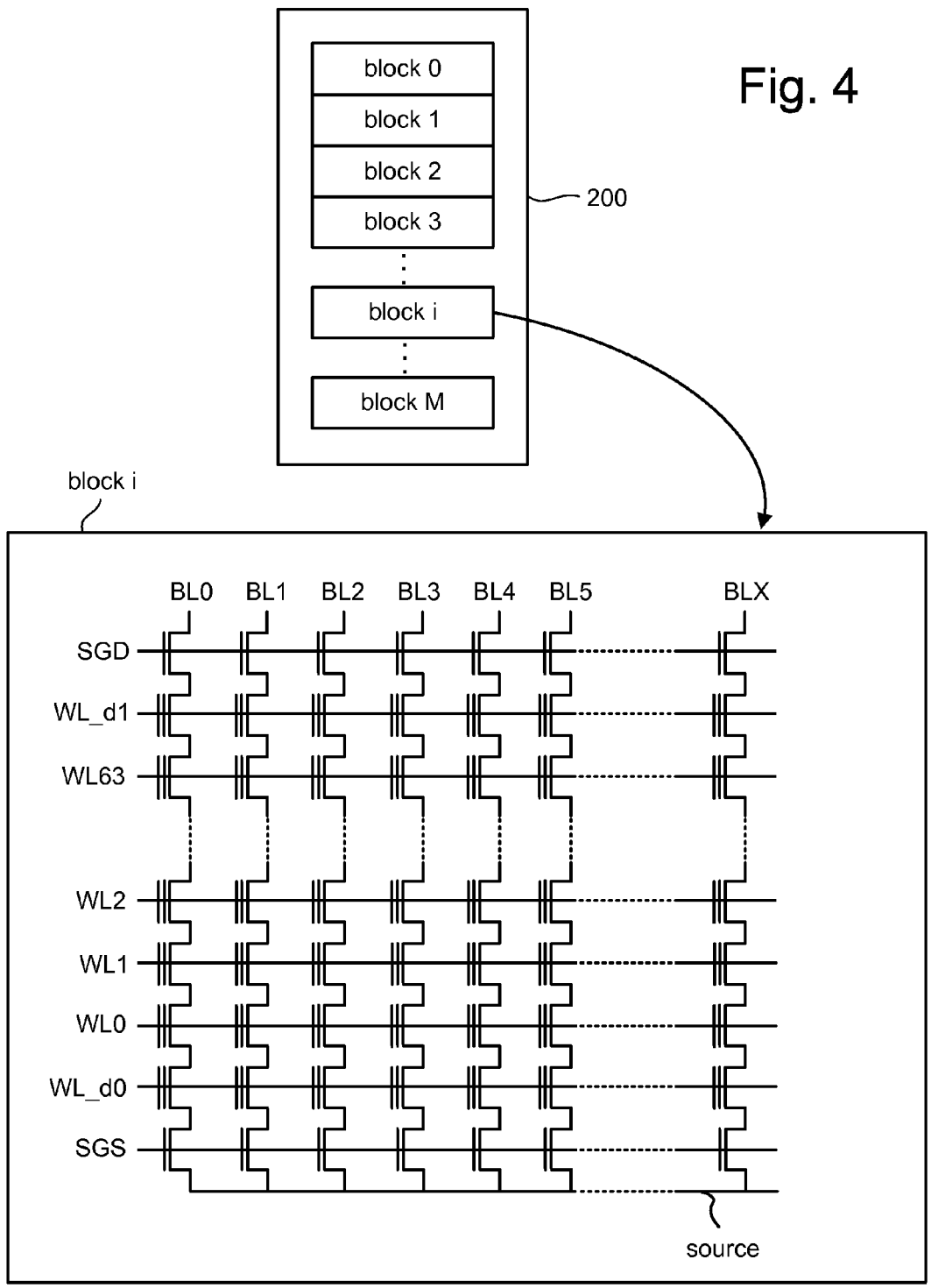
FIG. 4 depicts an exemplary structure of memory cell array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 also shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 5:
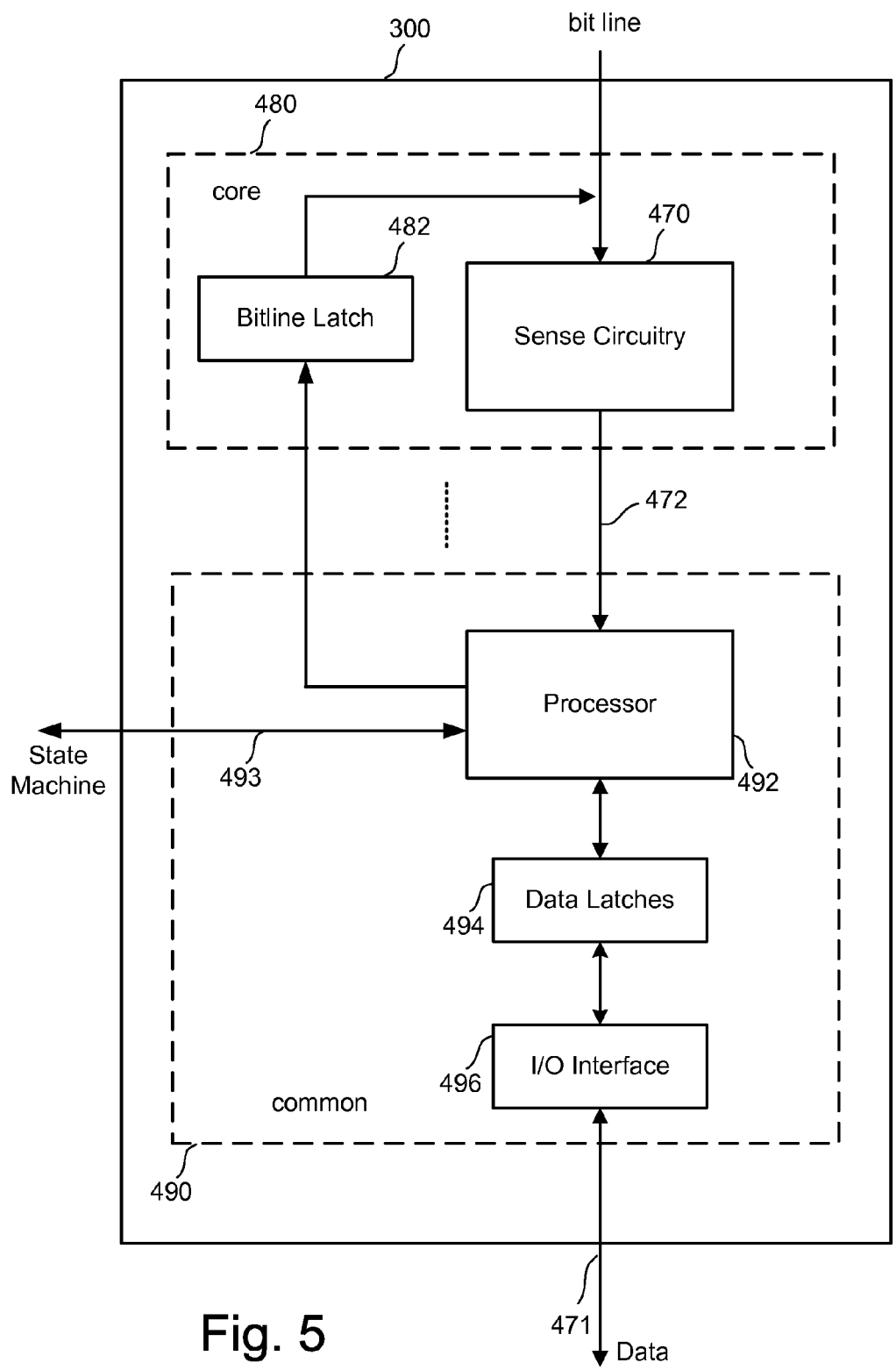
FIG. 5 is a block diagram of an individual sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, filed Dec. 29, 2004, and titled, "Non-volatile memory and method with shared processing for an aggregate of read/write circuits," which is hereby incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 471. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 471 during a program operation. The imported data bits represent write data meant to be programmed into the memory. I/O interface 496 provides an interface between data latches 494 and the data bus 471.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 471. The program operation, under the control of the state machine, comprises a series of programming voltage pulses (with increasing magnitudes) applied to the control gates of the addressed memory cells. Each programming pulse may be followed by a verify process to determine if the memory cell has been programmed to the desired state. Processor 492 monitors the verified memory state relative to the desired memory state. When the two are in agreement, processor 492 may set the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 471, and vice versa. In one embodiment, all the data latches corresponding to the read/write block of M memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Pat. No. 7,046,568; (4) U.S. Pat. No. 7,196,928, "Compensating for Coupling During Read Operations of Non-Volatile Memory," and (5) U.S. Pat. No. 7,327,619, "Reference Sense Amplifier For Non-Volatile Memory". All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A depicts example threshold voltage distributions for states of memory cells in which there are eight states. The eight data states include an erase state and states A-G. In this example, three bits may be stored per memory cell. Between each of the data states are read reference voltages used for reading data from memory cells. For example, FIG. 6A shows read reference voltage VrA between data states erase and A, and VrB between data states A and B. By testing whether the threshold voltage of a given memory cell is above or below the respective read reference voltages, the system can determine what state the memory cell is in. At or near the lower edge of each data state are verify reference voltages. For example, FIG. 6A shows VvA for state A and VvB for state B, etc. When programming memory cells to a given state, the system will test whether those memory cells have a threshold voltage greater than or equal to the verify reference voltage.

In some embodiments, there may be some overlap between threshold voltage distributions. FIG. 6B depicts one such example when three bits are stored per memory cell. Note that this distribution may occur immediately after programming. An ECC algorithm can be used to correct misreads, providing there are not too many. The verify and read levels are just one example. Other verify and read levels may be used.

Although the programming examples depict eight data states and three pages of data, the concepts taught can be applied to other implementations with more or fewer than eight states and more or fewer than three pages. Moreover, in the example programming techniques discussed, the Vth of a storage element is raised gradually as it is programmed to a target data state. However, programming techniques can be used in which the Vth of a storage element is lowered gradually as it is programmed to a target data state. Programming techniques which measure storage element current can be used as well. The concepts herein can be adapted to the different programming techniques.

Also note that contrary to the equal spacing/width of the depicted threshold voltage distributions, various distributions may have different widths/spacings in order to accommodate varying amounts of susceptibility to data retention loss.

Figure 7A:
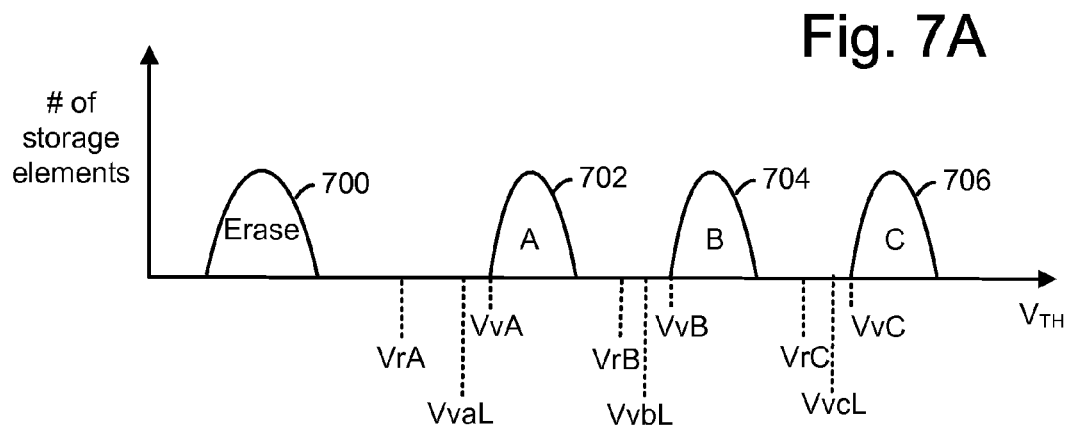
FIG. 7A depicts an example set of threshold voltage distributions for a four-state memory device in which each storage element stores two bits of data.

In some embodiments, a "verify low" and a "verify high" reference voltage is used. FIG. 7A depicts an example set of threshold voltage distributions for a four-state memory device in which each storage element stores two bits of data. A first threshold voltage distribution 700 is provided for erased (Erased-state) storage elements. Three threshold voltage distributions 702, 704 and 706 represent programmed states A, B and C, respectively. In one embodiment, the threshold voltages in the Erased-state are negative, and the threshold voltages in the A-, B- and C-states are positive.

Read reference voltages, VrA, VrB and VrC, are also provided for reading data from storage elements. By testing whether the threshold voltage of a given storage element is above or below VrA, VrB and VrC, the system can determine the state, e.g., programming condition, the storage element is in.

Further, verify reference voltages, VvA, VvB, and VvC are provided. When programming storage elements to the A-state, B-state or C-state, the system will test whether those storage elements have a threshold voltage greater than or equal to VvA, VvB or VvC, respectively. In one embodiment, "verify low" reference voltages, VvaL, VvbL, and VvcL are provided. Similar "verify low" reference voltages could also be used in embodiments with a different number of states.

Figure 7B:
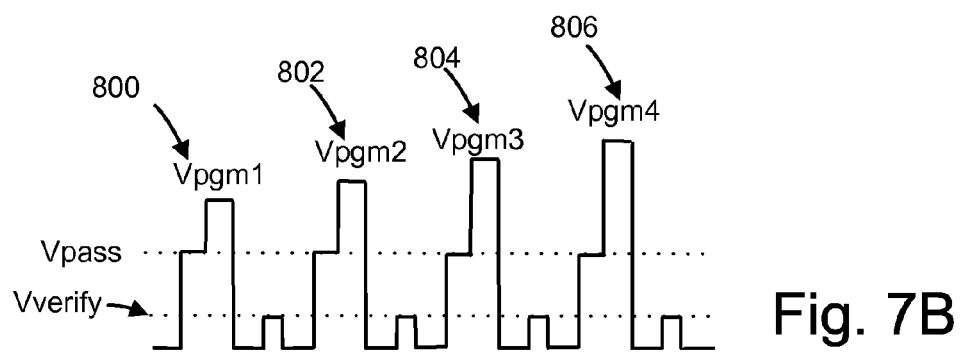
FIG. 7B shows a series of program pulses that may be used to program a distribution of FIG. 7A.

In full sequence programming, storage elements can be programmed from the Erased-state directly to any of the programmed states A, B or C. For example, a population of storage elements to be programmed may first be erased so that all storage elements in the population are in the Erased-state. A series of program pulses such as depicted in FIG. 7B is used to program storage elements directly into the A-, B- and C-states. While some storage elements are being programmed from the Erased-state to the A-state, other storage elements are being programmed from the Erased-state to the B-state and/or from the Erased-state to the C-state. Note that using a full sequence programming is not required.

One example of a slow programming mode uses low (offset) and high (target) verify levels for one or more data states. For example, VvaL and VvA are offset and target verify levels, respectively, for the A-state, and VvbL and VvB are offset and target verify levels, respectively, for the B-state. During programming, when the threshold voltage of a storage element which is being programmed to the A-state as a target state (e.g., an A-state storage element) exceeds VvaL, its programming speed is slowed, such as by raising the bit line voltage to a level, e.g., 0.6-0.8 V, which is between a nominal program or non-inhibit level, e.g., 0 V and a full inhibit level, e.g., 2-3 V. This provides greater accuracy by avoiding large step increases in threshold voltage. When the threshold voltage reaches VvA, the storage element is locked out from further programming. Similarly, when the threshold voltage of a B-state storage element exceeds VvbL, its programming speed is slowed, and when the threshold voltage reaches VvB, the storage element is locked out from further programming. In one approach, a slow programming mode is not used for the highest state since some overshoot is typically acceptable. Instead, the slow programming mode can be used for the programmed states, above the erased state, and below the highest state.

Moreover, in the example programming techniques discussed, the threshold voltage of a storage element is raised as it is programmed to a target data state. However, programming techniques can be used in which the threshold voltage of a storage element is lowered as it is programmed to a target data state. Programming techniques which measure storage element current can be used as well. The concepts herein can be adapted to different programming techniques.

FIG. 7B depicts a series of program and verify pulses which are applied to a selected word line during a programming operation. A programming operation may include multiple programming iterations, where each iteration applies one or more program pulses (voltages) followed by one or more verify voltages, to a selected word line. In one possible approach, the program voltages are stepped up in successive iterations. Moreover, the program voltages may include a first portion which has a pass voltage (Vpass) level, e.g., 6-8 V, followed by a second portion at a program level, e.g., 12-25 V. For example, first, second, third and fourth program pulses 800, 802, 804 and 806 have program voltages of Vpgm1, Vpgm2, Vpgm3 and Vpgm4, respectively, and so forth. A set of one or more verify voltages may be provided after each program pulse. In some embodiments, there may be two or more verify pulses between the program pulses. For example, one pulse might be used to verify the A-state and the B-state, a second may be used to verify the C-state and a D-state, etc. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

Figure 8A:
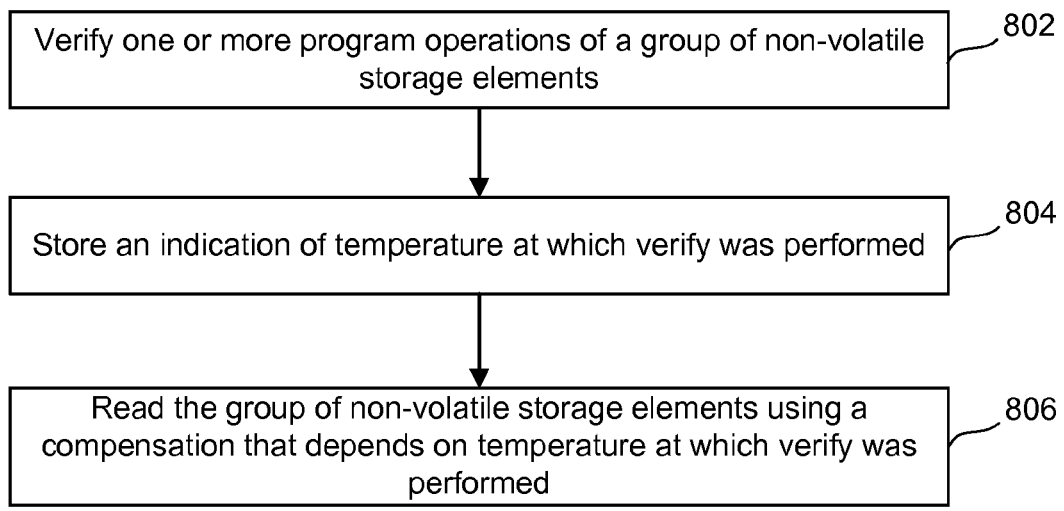
FIG. 8A is a flowchart of one embodiment of a process for reading non-volatile storage using compensation that depends on the temperature at which program verify occurred.

FIG. 8A is a flowchart of one embodiment of a process for reading non-volatile storage using compensation that depends on the temperature at which program verify occurred. The compensation may be used to modify how memory cells are sensed. In step 802, verifying one or more program operations of a group of non-volatile storage elements is performed. This may occur during a programming process such as the embodiment of FIG. 8B. Step 802 may include performing one or more verify operations.

In one embodiment, the verify levels that are used are compensated based on temperature. One factor in the compensation may be the Tco, or temperature dependence of the memory cells Vt. However, the compensation may also be based on one or more factors that are independent of Tco. That is, the compensation is not simply used to adjust for the temperature dependence of the memory cell's Vt. In one embodiment, the Tco-independent component of the compensation depends on temperature dependence of the individual threshold distributions of the memory cells. In one embodiment, the compensation has a component that compresses the Vth distribution window of the memory cells as a function of temperature. For example, there may be more compression of the Vth distribution window with higher temperature. As noted above, the Vth distribution window may be defined as the total amount of gaps between the individual Vth distributions for all adjacent states.

In step 804, an indication of the temperature at which program verify was performed is stored. There are many ways to store this indication of temperature. In one embodiment, some indication is stored in spare memory cells on the word line being programmed. Details of determining the temperature are discussed in connection with FIG. 8B.

In step 806, the group of non-volatile storage elements are read using compensation that depends on the temperature during the program verify. In one embodiment, this read compensation compensates for temperature dependence of Vth distribution widths that occurred during program verify. Thus, using read levels that depend on program verify temperature may provide more accurate read levels, which may minimize the overall read errors. In one embodiment, the read compensation compensates for shifts in verify levels that result from using compensation during program verify that depends on the temperature dependence of Vth distributions.

In one embodiment, the compensation is to adjust the read levels. For example, referring to FIG. 7A, the level VrA may be adjusted up or down depending on the temperature during program verify. Note that adjusting read levels may be achieved in many ways. One technique is to adjust the reference voltage that is applied to the selected word line. However, other types of compensation may be used. For example, a technique used to sense the conduction current of the memory cells may be adjusted. As one particular example, the conduction current may be sensed for a longer or shorter period of time (possibly applying the same read reference voltage to the selected WL in all cases). Using a different sensing period may have the effect of testing for a different threshold voltage. Therefore, this may have the effect of using a different read reference level. Any combination of these techniques, or others, may be used to adjust the read levels.

Note that the compensation of step 806 is different from performing a read using compensation that depends only on the temperature during read. As noted, such compensation may compensate only for the temperature dependence (Tco) of the memory cell's Vt. However, note that the read levels in step 806 may be determined, in part, based on the present temperature in order to compensate for the memory cells' Tco.

Note that any amount of time may pass between the program verify and the read. The temperature during read may be the same as, higher than, or lower than the temperature during program verify.

Figure 8B:
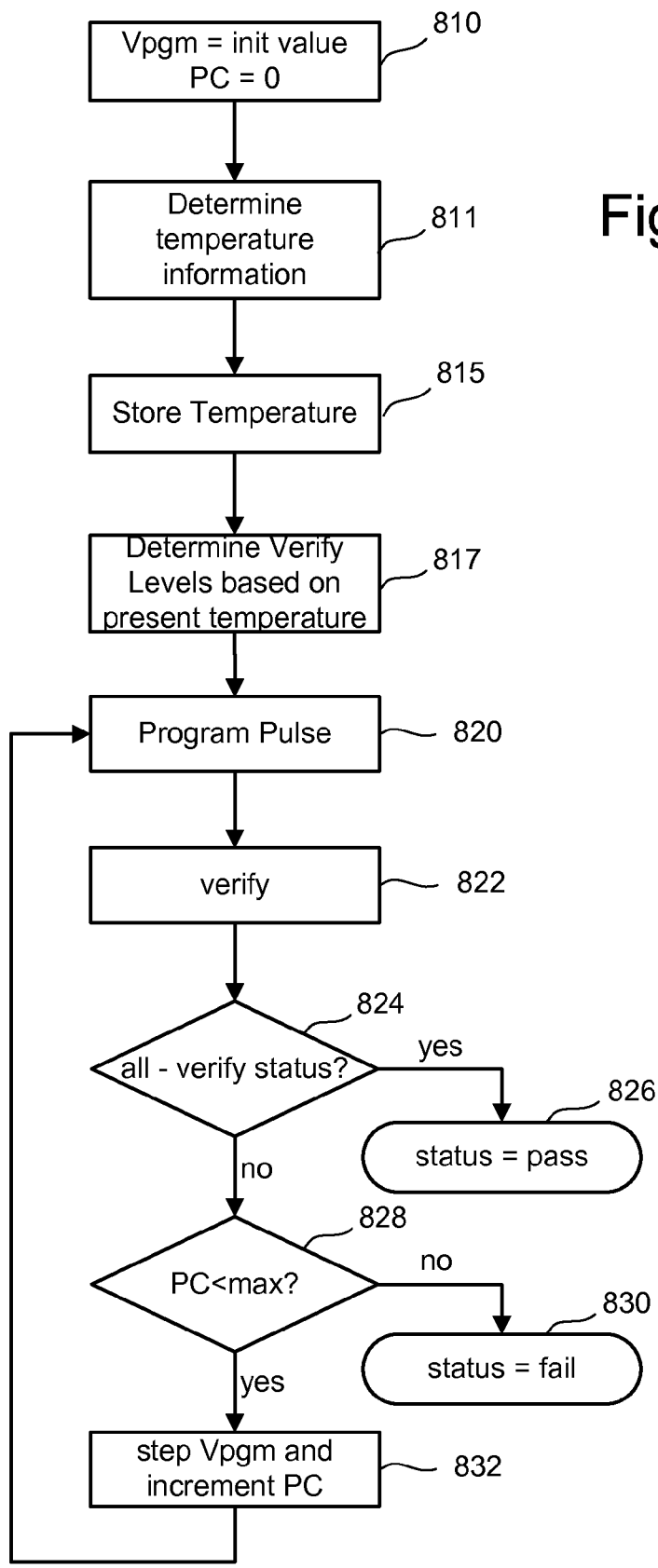
FIG. 8B is a flowchart describing one embodiment of a programming process, which includes one or more verification steps.

FIG. 8B is a flowchart describing one embodiment of a programming process, which includes one or more verification steps. In one embodiment, the process is used to program memory cells on a selected word line. In one embodiment, the process is used to program every memory cell on the selected word line. In one embodiment, the process is used to program every other memory cell (e.g., odd/even programming) on the selected word line.

In step 810, the program voltage (Vpgm) is set to an initial value. Also, in step 810, a program counter (PC) is initialized to zero. In step 811, temperature information is determined. In one embodiment, the system will take a reading of the current temperature. In one embodiment, there is a temperature sensor 228 in communication with controller 244, state machine 222, or other circuits. In another embodiment, temperature sensor 228, on the memory chip, is used to provide temperature data to state machine 222, controller 244, or another circuit. In another embodiment, controller 244 includes an onboard temperature sensor. In another embodiment, the host will provide temperature data to controller 244. No specific means for obtaining the current temperature is required.

In one embodiment, a temperature dependent circuit 229 is used to produce a signal that depends, at least in part on the present temperature. As one example, circuit 229 could produce a reference current or voltage whose magnitude depends on that current temperature.

In step 815, the temperature information is stored. This temperature information may be used during later reads to determine suitable read levels. The temperature information is provided from temperature sensor 228 in one embodiment. As one example, the temperature information may be a digital value that represents degrees (in any suitable scale). If temperature dependent circuit 229 was used to provide a reference current or voltage, then the temperature information may be based on this reference current or voltage. As one example, the temperature information may be a digital value that represents the magnitude of the reference current or voltage.

In step 817, suitable verify levels are determined. In one embodiment, suitable verify levels (e.g., VvA, VvB, VvC) are determined based on the present temperature. In one embodiment, suitable verify low levels (e.g., VvaL, VvbL, VvcL) are determined based on temperature. Note that compensating for temperature variations may have a component that depends on the memory cell's Tco and a component that is independent of the memory cell's Tco. In one embodiment, the component that is independent of the memory cell's Tco is used to compensate for temperature dependence of the individual threshold distribution widths for each state. Further details of the component that is independent of the memory cell's Tco are discussed below.

In one embodiment, determining the suitable verify levels includes accessing a lookup table. This lookup table may be based on Equation 2 below, but is not so limited. Note the determining suitable verify levels does not necessarily mean that an actual voltage level to apply to the selected word line needs to be determined. For example, a circuit such as temperature dependent circuit 229 may be used to generate a reference current or voltage whose magnitude depends on present temperature, and other inputs. One of those inputs could be a compensation factor (e.g., Tcoprogi in Equation 2 below). Thus, the suitable verify level may be based on the output reference current or voltage of temperature dependent circuit 229.

In step 820, a program pulse is applied. In step 822, a verification process is performed. As noted, the verify levels may be based on the present temperature.

In one embodiment, the verification is a concurrent coarse/fine verify. Referring to FIG. 7A, as one example, some memory cells that are being programmed to the A-state are verified using the VvaL level, and others that are being programmed to the A-state are verified using the Vva level. During the initial programming steps in which the memory cell's threshold is well below the final level (Vva), course programming may be applied. However, after the memory cell's threshold voltage reaches VvaL, fine programming may be used. Thus, some memory cells are verified for coarse programming, whereas other memory cells are verified for fine programming. Note that when a particular memory cell has been verified as being programmed to its intended state, it may be locked out from further programming. Note that using coarse/fine programming is not required. In one embodiment, the intermediate verify levels (e.g., VvaL, VvbL, etc.) are not used.

In step 824, it is determined whether all of the memory cells have verified that their threshold voltages are at the final target voltage for that memory cell. If so, the programming process is completed successfully (status=pass) in step 826. If all of the memory cells are not verified to have reached their final target levels, then it is determined whether the program counter (PC) is less than a maximum value such as 20. If the program counter (PC) is not less than max (step 828), then the program process has failed (step 830). If the program counter (PC) is less than a maximum value (e.g., 20), then the program counter (PC) is incremented by one and the program voltage is stepped up to the next pulse in step 832. Subsequent to step 832, the process loops back to step 820 and the next program pulse is applied to the memory cells.

As noted, a conventional Tco-scheme discussed in the background assumes that the Vth distribution widths of programmed states are independent of the temperature at which the data is programmed. Then, the Vth distributions will align well when data programmed at different temperatures is read back at same temperature. However, in practice, the Vth distribution widths may be temperature dependent.

Figure 9A:
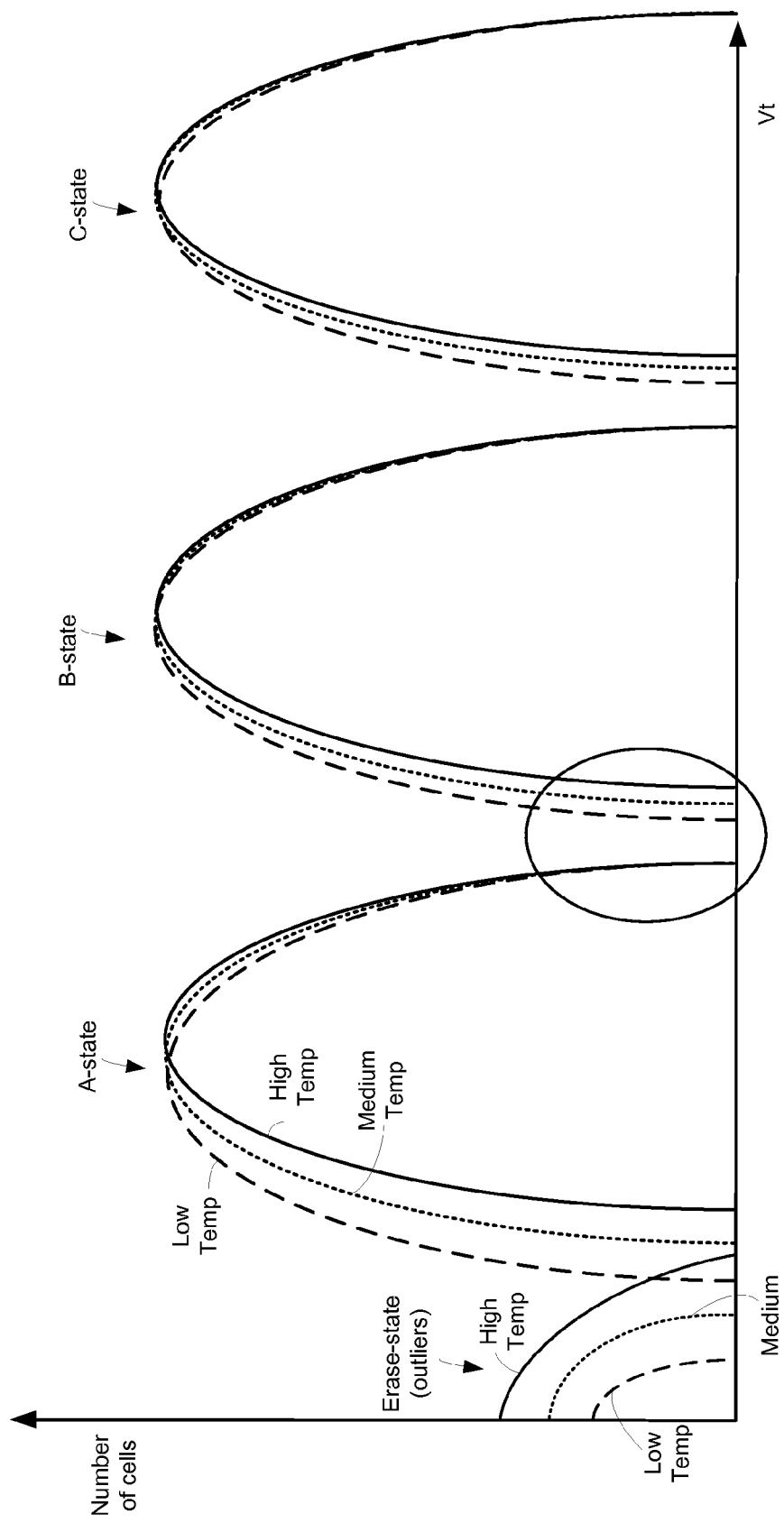
FIG. 9A shows example threshold voltage distributions for low-, medium-, and high-temperature during conventional programming.

FIG. 9A shows example threshold voltage distributions for low-, medium-, and high-temperature during conventional programming without applying embodiments of temperature compensation for the temperature dependence of the width of voltage distributions. However, conventional temperature compensation that depends on Tco is applied. The threshold voltage distributions are read at the same temperature while applying temperature compensation that depends on Tco. During programming, the Tco dependent temperature compensation applied on verify levels, depends on the program temperature (low, medium, or high).

Figure 9B:
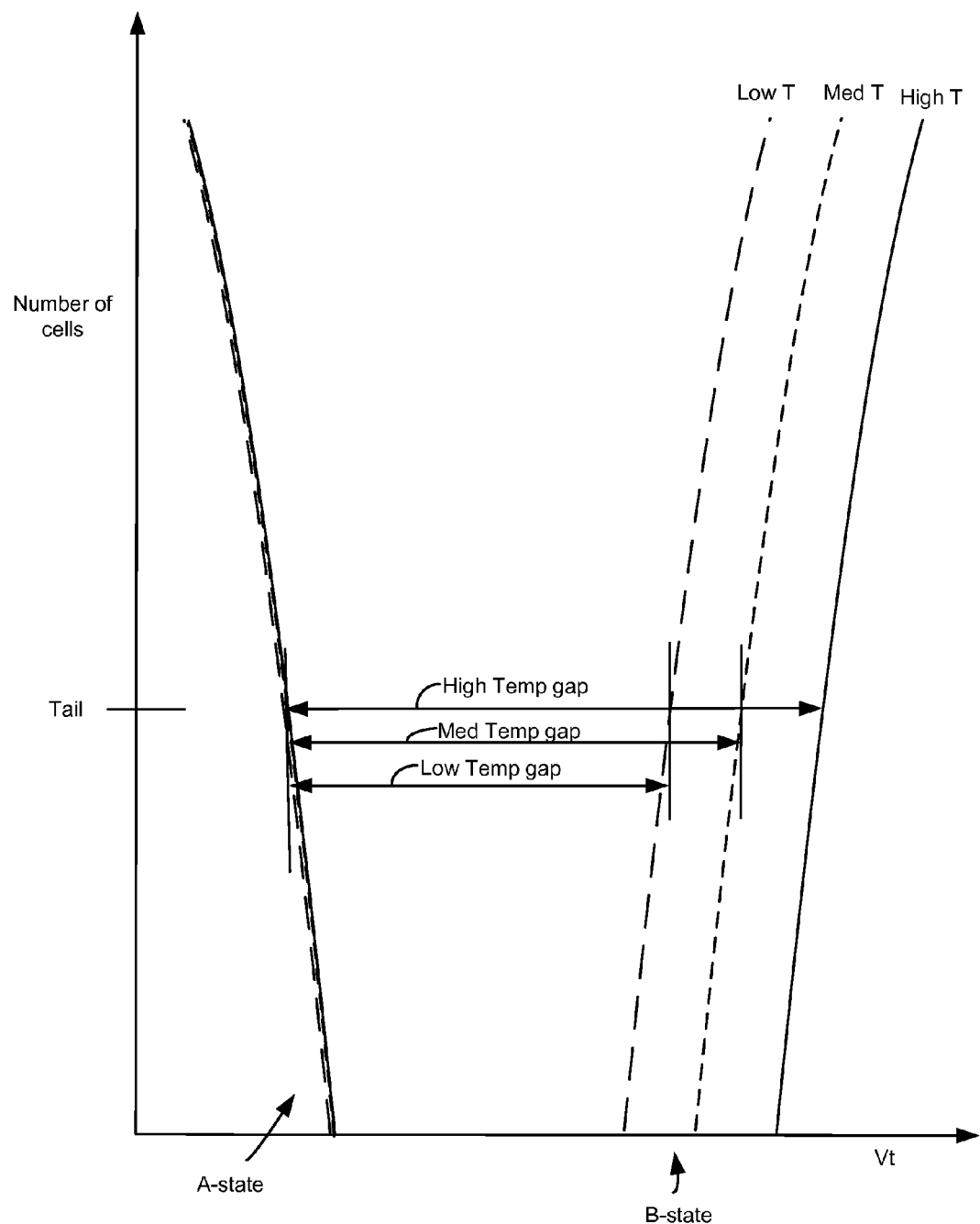
FIG. 9B shows the circled portion of the A-state and B-state from FIG. 9A.

FIG. 9B shows the circled portion of the A-state and B-state from FIG. 9A. A significant aspect of the conventional threshold voltage distributions is that their widths may depend on temperature. For example, the A-state width may be wider when programmed and verified at a low-temperature than a high-temperature. Likewise, the Vth distribution for other states such as the B-state may be wider when programmed and verified at a low-temperature. However, this effect might not be as pronounced with higher states. Note that the gap between the upper tail of the A-state and lower tail of the B-state is temperature dependent. The higher the temperature at program, the wider the gap. In this example, the upper tails of the A-state are roughly aligned for all example temperatures. However, this is not necessarily the case.

Figure 9C:
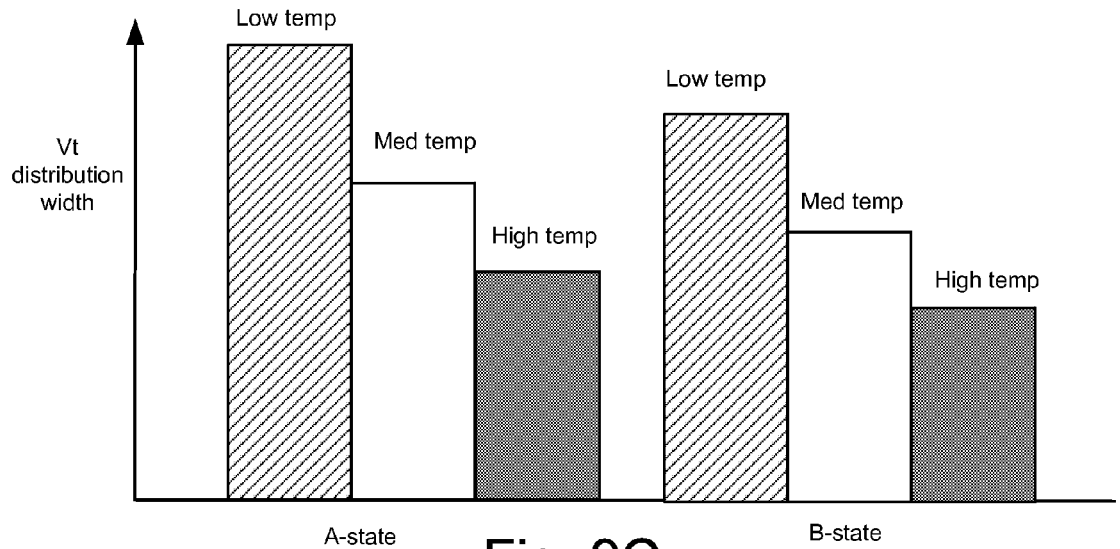
FIG. 9C shows a chart to illustrate that the width of the threshold distributions just after conventional programming may depend on the programming temperature.

FIG. 9C shows a chart to illustrate that the width of the conventional Vth distributions just after programming may depend on the programming (and hence verify) temperature. The y-axis represents Vth distribution width. Low-, medium-, and high-temperature programming cases are shown for both the A-state and B-state. As one example, the low-temperature A-state width might be about 1550 mV, the medium temperature A-state width might be about 1450 mV, the high-temperature A-state width might be about 1410 mV. This means there is about a 130 mV difference in width between the low- and high-temperature cases. As one example, the low-temperature B-state width might be about 60 to 90 mV wider than the high-temperature B-state width (although this could be greater or less). The low-temperature case may correspond to about −30 C, the mid-temperature case may correspond to about 25 C, and the high-temperature case may correspond to about 85 C. Note that there are a variety of factors that influence the width of the Vth distributions. Therefore, these values are only examples.

A possible cause of the Vth distribution widths being different is wider Vth lower-tails at lower temperature programming. A possible reason for this is that the trap time constant may be longer at lower temperature. Thus, if an electron gets trapped during the programming pulse (before the verify) at low temperature, then there is a greater chance that such an electron remains trapped during verify as well (compared to a high-temperature program). After programming and verifying is complete, the electron may eventually de-trap, leading to a Vth downshift resulting in a wider Vth distribution, especially on the lower-tail. This phenomenon of change in cell's Vth before and after verify, may also referred to as read/verify noise. In summary, the read/verify noise may be larger at low temperature leading to a wider lower-tail. The read/verify noise may tend to affect A-state cells the most, since A-verify is generally the first verify operation after the program pulse. However, B-state and C-state cells may also be affected by read/verify noise, although to a smaller degree. Thus, the difference in Vth distribution lower tails may tend to be largest for the A-state and gradually reduce for higher states such as the B-state and C-state.

The wider Vth distribution for lower temperatures are depicted in FIG. 9A. Referring back to FIG. 9A, note that the lower tail of the low-temperature A-state is lower than the lower tail for the higher temperatures. This means that there is less of a gap between 0V (or some other reference point) and the lower tail of the low-temperature A-state than the other temperatures. Conversely, there is a wider gap between 0V and the lower tail of the A-state for the high temperature. This gap will be discussed in more detail below. Note that 0V could be used as the read level for the A-state. Thus, the gap between 0V and the lower tail represents a window that provides a read margin, in this example.

Also note that there may be a greater gap between the upper tail of the A-state and the lower tail of the B-state for the high-temperature case than the others. FIG. 9B depicts a magnified portion of the A-state and B-state for the conventional low-temperature and high-temperature cases. A gap may be defined as the width between the individual Vth distributions for two adjacent states at some reference number of cells. A tail reference point is depicted on the y-axis, which represents a certain number of memory cells. As can be seen, the gap between the high-temperature A-state and B-state Vth distributions is greater than the low-temperature case in this example. Thus, the gap between the A-state and B-state Vth distributions may increase with temperature. The same may be true for other states, such as the B-state and C-state. However, it may be that this pattern does not follow for all neighboring states. In other words, this pattern is not a requirement.

Thus, the gap between 0V and the A-state may be wider for the conventional high-temperature case than the conventional low-temperature case. Also, the gap between individual Vth distributions for the high-temperature case may be wider than the conventional low-temperature case for other states. Thus, the sum of these gaps may be greater for the conventional high-temperature case than for the conventional low-temperature case. The medium temperature gaps may be somewhere between the other two. Herein, the sum of the gaps may be referred to as the Vth distribution window.

Another aspect to note about the gaps in FIG. 9B, is that the midpoint of the gaps is different for the low- and high-temperature cases. In one embodiment, optimum read levels at which the errors may be minimized, are selected based on the midway point along this gap. Therefore, note that the optimum read levels may depend on the temperature at which verify was performed. In one embodiment, the read levels are determined based on the temperature at which verify was performed.

Another way to think about the Vth distribution window is by referring to the Vth distribution widths. Referring to FIG. 9C, the Vth distribution widths for the conventional high temperature case may be considerably less than for the conventional low-temperature case. The total Vth distribution width refers to the sum of the individual Vth distribution widths for each state. For example, if the difference in A-state widths (low-versus high-temperature) is 130 mV and the difference in B-state widths is 70 mV, this allows for the conventional high-temperature Vth distribution window to be reduced by 200 mV, while still allowing for the same gap size between adjacent Vth distributions. There may be still further room for "compression" of the Vth distribution window if the C-state is factored in. Also, if three or more bits are stored per memory cell, there may be additional states to factor in.

Figure 9D:
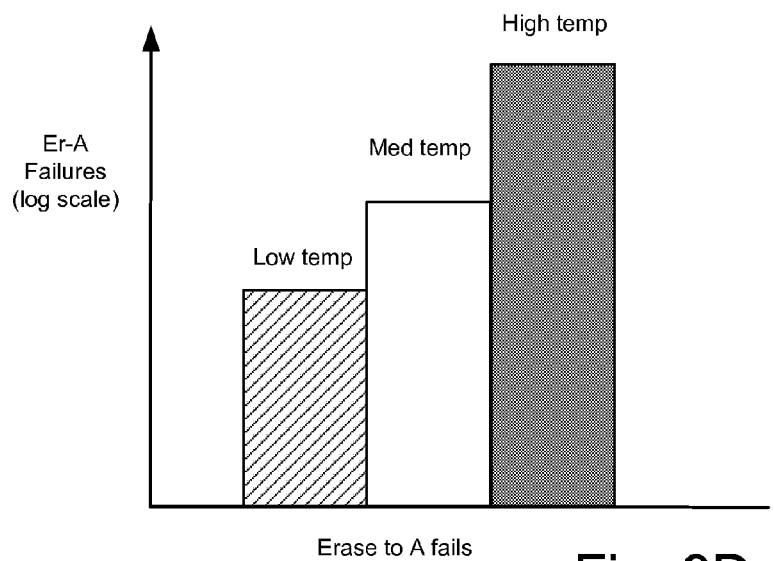
FIG. 9D is a chart that illustrates how the Er-A failures may increase with higher program temperatures during conventional programming.

Another aspect to note is that conventionally the Erase-to-A (or Er-A) failures may be quite high at higher programming temperatures. An Er-A failure refers to the situation in which a memory cell was intended to be in the erased state, but is read as being in the A-state. FIG. 9D is a chart that illustrates how conventionally the Er-A failures may increase with higher program temperatures. The y-axis represents Er-A failures. Low-, medium-, and high-temperature conventional programming cases are shown. As is illustrated, there may be significantly more Er-A failures when programming at a higher temperature. Note that this may be a log scale; therefore, the number of high-temperature failures may far exceed low-temperature failures. As one example, there might be 10 or so failures at low-temperature and 100 or so failures at high-temperature. Note that ECC is able to correct Er-A failures, providing there are not too many. However, even if errors are correctable, the read may take longer due to the error correction algorithm.

A possible reason for the additional Er-A failures at higher programming temperatures is due to greater leakage of the boosting potential at higher temperatures. Note that the channel potential may be boosted during programming for the inhibited channels, to reduce or prevent program disturb (e.g., unintended programming). However, there may be some current that leaks between the boosted channel and the substrate, thereby reducing the boosting potential. This leakage may be greater at higher temperatures. Note that the number of Er-A failures may depend on a variety of factors.

Thus, the Er-A failures may be much greater for the high-temperature case. Also note that, as previously discussed, the conventional high-temperature programming case may allow for the total gap window to be compressed. Therefore, this compression may be taken advantage of to reduce Er-A failures.

Figure 10A:
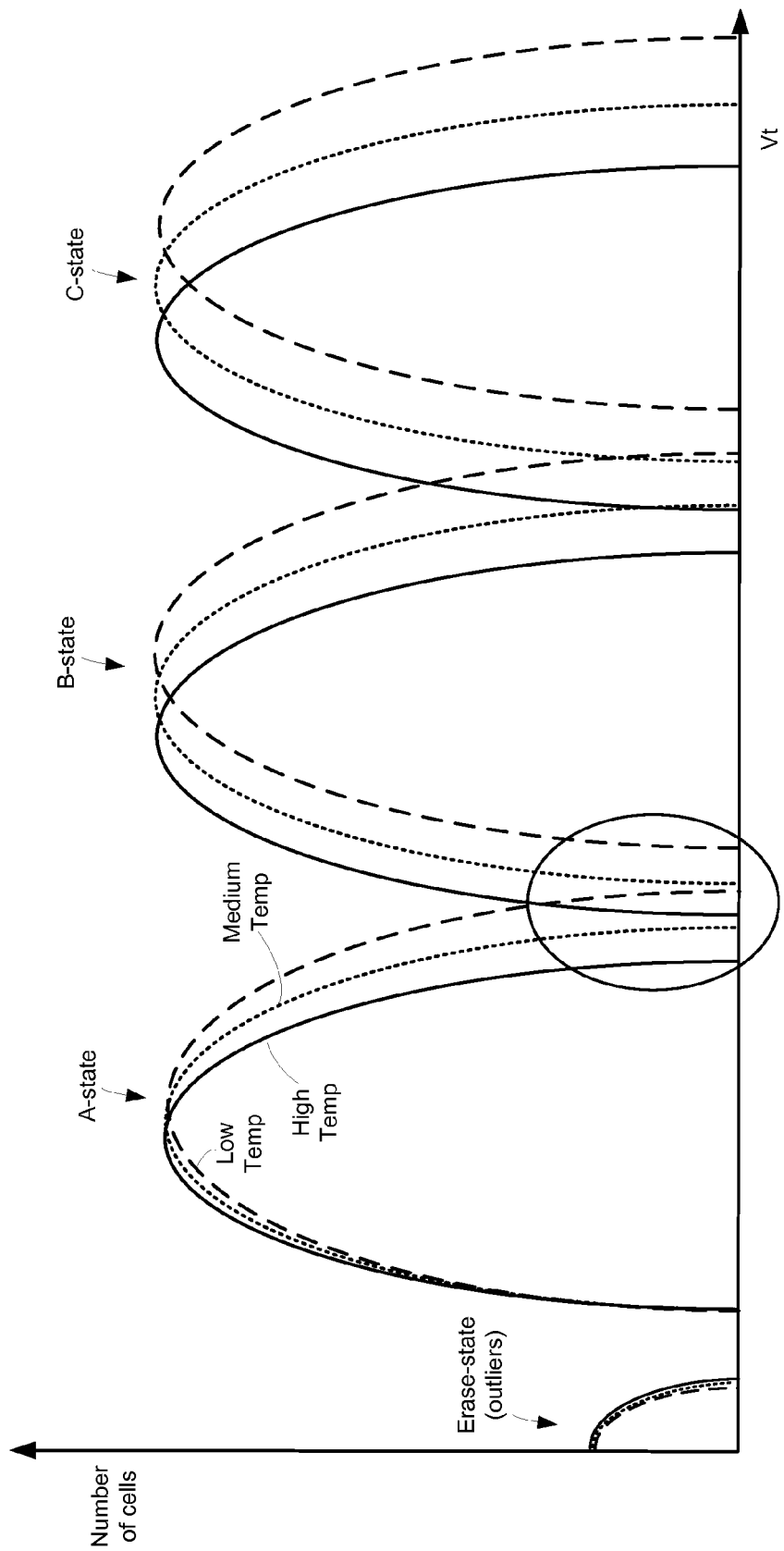
FIG. 10A shows threshold voltage distributions when applying one embodiment of temperature compensation.

FIG. 10A shows threshold voltage distributions in accordance with one embodiment of providing read or verify level compensation based on temperature dependence of Vth distributions. The Vth distributions are for three programming cases: low-, medium-, and high-temperature. The three sets of Vth distributions are for a read at the same (arbitrary) temperature.

FIG. 10A shows that the lower tail of the high-temperature A-state has been shifted down (or conversely low-temperature A-state has been shifted up, or a combination thereof) to be at about the same point as the lower tail of the low-temperature A-state. The lower tail of the medium-temperature case has also been shifted down to be at about the same point as the lower tail of the others. This may be achieved by determining a suitable reference voltage for verifying the A-state, wherein the reference voltage depends on the temperature of program. In one embodiment, this downshift (or upshift) compensates for the temperature dependence of the Vth distribution width of the A-state. Referring back to FIG. 9A, recall that the lower tail of the A-state may be lower for lower temperatures. As discussed above, a possible reason for this is the temperature dependence of the time constant of the traps (which may trap electrons). However, there may be other reasons for the temperature dependence of the Vth widths.

Figure 10B:
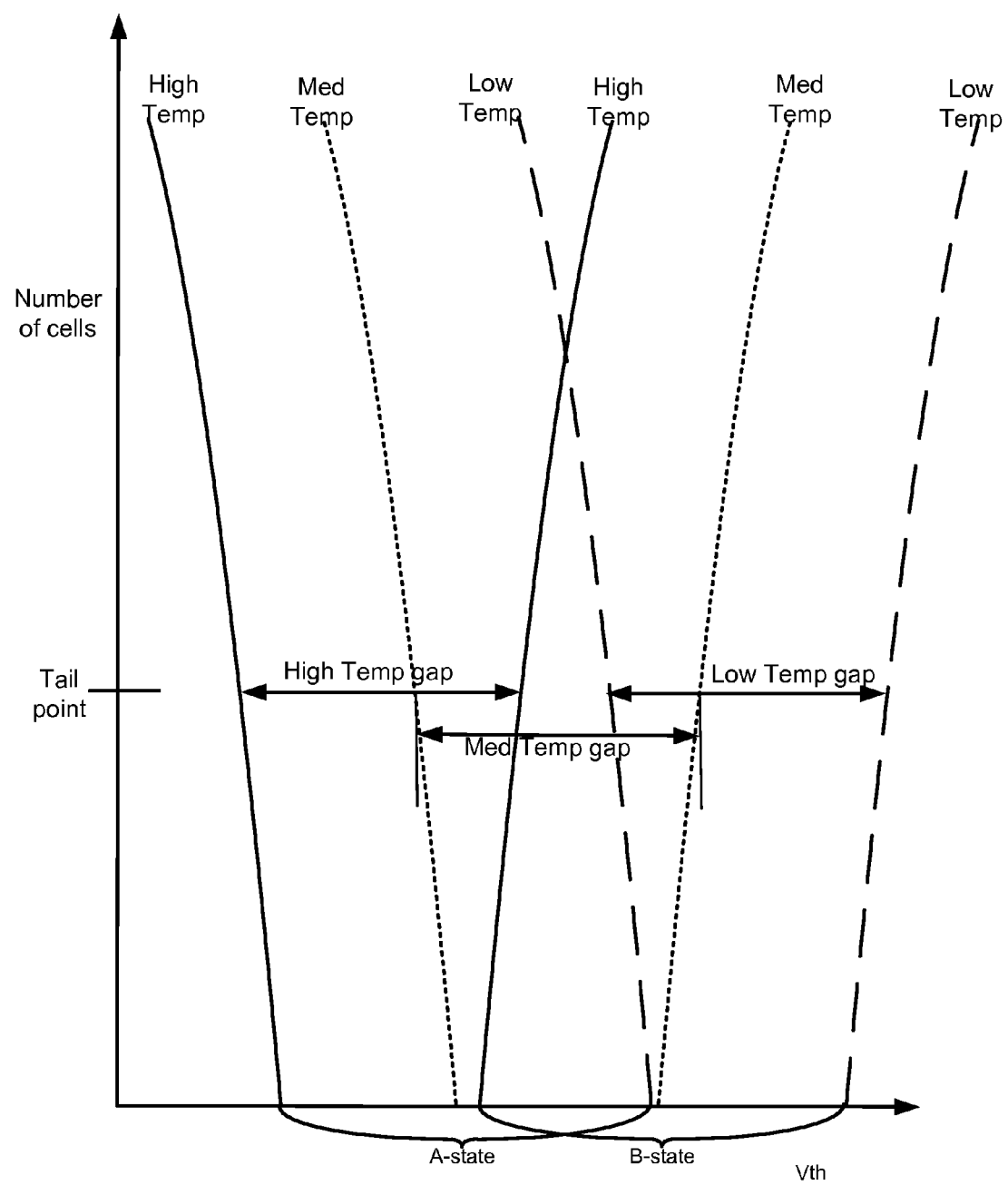
FIG. 10B shows an enlarged view of the circled portion of the A-state and B-state of the threshold voltage distributions from FIG. 10A.

FIG. 10B shows a magnified view of the circled portion of the A-state and B-state from FIG. 10A. Note that the high-, medium- and low-temperature gaps are about the same. In this embodiment, compensation may be used to shift the high temperature Vth distribution for the B-state to the left or to the right to achieve a desired gap. Compensation may also be used for the medium temperature case. This may be achieved by determining a suitable reference voltage for verifying the B-state, wherein the reference voltage depends on the temperature of program.

Note that the upper tail of the A-state distribution may also have been shifted down more for higher temperatures, as a result of shifting the lower tail of the A-state down. However, the lower tail for the B-state may be shifted more than the upper tail for the A-state (referring to the high-temperature case). What this means is that the separation between the upper tail of the A-state and the lower tail of the B-state is reduced for the high-temperature case. This may be achieved by suitable selection of verify reference voltages. In other words, VvB may be shifted down more than VvA for the high temperature case than for the low-temperature case. In one embodiment, a different amount of compensation (based on temperature) is used for determining VvA than for VvB.

Note that an alternative to shifting the A-state down for higher temperatures may be to shift up the A-state distribution more for lower temperatures. Again, the gaps in FIG. 10B may be kept relatively uniform across temperature with a suitable choice of B-verify levels.

In one embodiment, the shifts to VvA and VvB are such that the gap between the Vth distributions for the A-state and B-state is about the same regardless of temperature. In contrast, using conventional compensation that only compensates for Tco, this gap size may depend on temperature. Note that it is not required in all embodiments to have the gap size uniform across the entire operating temperature range. However, as will be discussed more fully below, reducing the extra gap for higher (and possible moderate) temperatures can help to reduce failures, such as Er-A failures for higher (and possible moderate) temperatures.

Also note that while the foregoing discussion pertains to the gap between the A-state and B-state, gaps between other states may be adjusted based on the verify temperature. For example, the gap between the B-state and C-state might be wider at higher temperature if only compensation for Tco was used. In one embodiment, this gap is reduced for higher temperatures. In one embodiment, this gap is made to be approximately uniform across all operating temperatures. However, a uniform gap size is not required. As done for A-state and B-state, this may be achieved by determining a suitable reference voltage for verifying the C-state, wherein the reference voltage depends on the temperature of program. Also, as in the case for A-state and B-state, VvC may be shifted down more than VvB for the high temperature case than for the low-temperature case.

Referring back to FIG. 10A, note that the erase state outliers have also been reduced, at least for higher temperatures. In one embodiment, the erase state distribution is shifted down more for higher temperatures. Thus, the high-temperature erase state distribution is shifted down the most. This down-shift of the erase state distribution may reduce the outliers, which could cause Er-A fails. Thus, the down-shift of the erase state distribution may help to reduce Er-A failures. A factor that helps to shift down the erase state distribution at higher temperature is the shift down imposed on C-state at higher temperature by using a lower C-verify level (VvC) at higher temperature, as compared to the conventional compensation scheme. Lower VvC reduces the programming voltages required to program cells to the C-state at higher temperature, which makes it easier to inhibit a cell from programming, thus reducing Er-A failures. In other words, lower programming voltages are made possible due to the compression of the Vth window at higher temperature. This can be viewed as giving up a portion of the Vth window at higher temperature to benefit in Er-A failures. However, as mentioned above, the Vth window at higher temperature is wider than at lower temperature; while the Er-A failures are worse at higher temperature. Thus giving up the extra Vth window at higher temperature in return for improved Er-A failures, results in overall reduction in total errors at higher temperature.

One aspect of the shift to the verify reference levels (which may be based on the program temperature dependence of Vth distribution widths) is that the Vth distributions for different program temperatures do not necessarily overlap. For example, the Vth distributions programmed at low temperature do not necessarily overlap with the Vth distributions programmed at high-temperature. In one embodiment, read levels should be in about the middle of the gap between two adjacent states. Referring to FIG. 10B, it may be seen that the midpoint of the gap is at a different Vth for the low-, medium- and high-temperature cases. What this means is that the optimum read levels may be depend on the program (and hence verify) temperature. Stated another way, at a give read temperature, the optimum read level if program verify occurred at low-temperature may be different than the optimum read level if program verify occurred at high-temperature. Therefore, the temperature at program verify is stored in one embodiment, which allows the read levels to depend on the program verify temperature.

In this example, the range of the gap (as measured from Vth of the upper tail to the Vth of the lower tail of adjacent states) may have been affected by the compensation used during verify. As discussed, the verify levels may be shifted based on the temperature dependence of the Vth distribution widths. Therefore, determining suitable read levels may compensate for the shift to the verify levels.

The following example will be used to illustrate the foregoing. Assume that the memory cells were programmed at a low-temperature (e.g., −30 C) and a high-temperature (e.g., 85 C). During read, the optimum read levels depend on the program verify temperature in one embodiment. For example, the optimum read level for VrB may be 150 mV less for memory cells programed at the high-temperature than for low-temperature programming. Note that this may assume reading back at the same temperature for each case. Also, this is just one example; the voltages could be greater or less. As one example, the optimum read level for VrC may be 165 mV less for memory cells programed at the high-temperature than for low-temperature. However, this is also just one example. Assuming, 150 mV less for VrB, the optimum read level for VrC could be more or less than 150 mV.

Further details of one embodiment of temperature compensation in which read level compensation depends on verify temperature will now be discussed. In one embodiment, Equation 2 is used to determine a suitable verify reference level, and Equation 3 is used to determine a suitable read reference level.

$$BV(at T){:}BV_0+(Tco\_prog_1+Tco)*Tprog \qquad \text{Eq. 2}$$

$$BR(at T){:}BR_0+Tco\_prog_2*Tprog+Tco*Tread \qquad \text{Eq. 3}$$

In Equation 2, $BV_0$ is a base (or default) verify level for the B state. In Equation 3, $BR_0$ is a base (or default) read level for the B state. Tprog is the temperature during program verify, and Tread is the temperature during read. Tco may be used to compensate for the temperature dependence of the memory cell's Vt. $Tco\_prog_1$ and $Tco\_prog_2$ may be independent of Tco. In other words, they may be independent of the temperature dependence of the memory cell's Vt. They may be a function of the program temperature dependence of Vth distribution widths. In other words, Tcoprogi and $Tco\_prog_2$ may compensate for the differences in Vth distribution widths at different program temperatures.

Note that a similar equation could be used to determine reference values for the A-state, C-state, and other states (if more states are used). In one embodiment, the value for $Tco\_prog_1$ depends on the state. In one embodiment, the value for $Tco\_prog_2$ depends on the state. In one embodiment, the values for both $Tco\_prog_1$ and $Tco\_prog_2$ depend on the state. In one embodiment, using different values for $Tco\_prog_1$ (for different states) may be used to control the gap between adjacent states.

In one embodiment, $Tco\_prog_1$ and $Tco\_prog_2$ are both negative values. Note that Tco may also be negative in value. $Tco\_prog_1$ and $Tco\_prog_2$ can be imagined as correction terms to correct the differences that are seen in programming behavior at different temperature. In one embodiment, for a specific state (such as B-state) the absolute magnitude of $Tco\_prog_2 < Tco\_prog_1$, which means the shift on verify levels at higher temperature is larger than the shift on read levels for the same state.

Figure 11A:
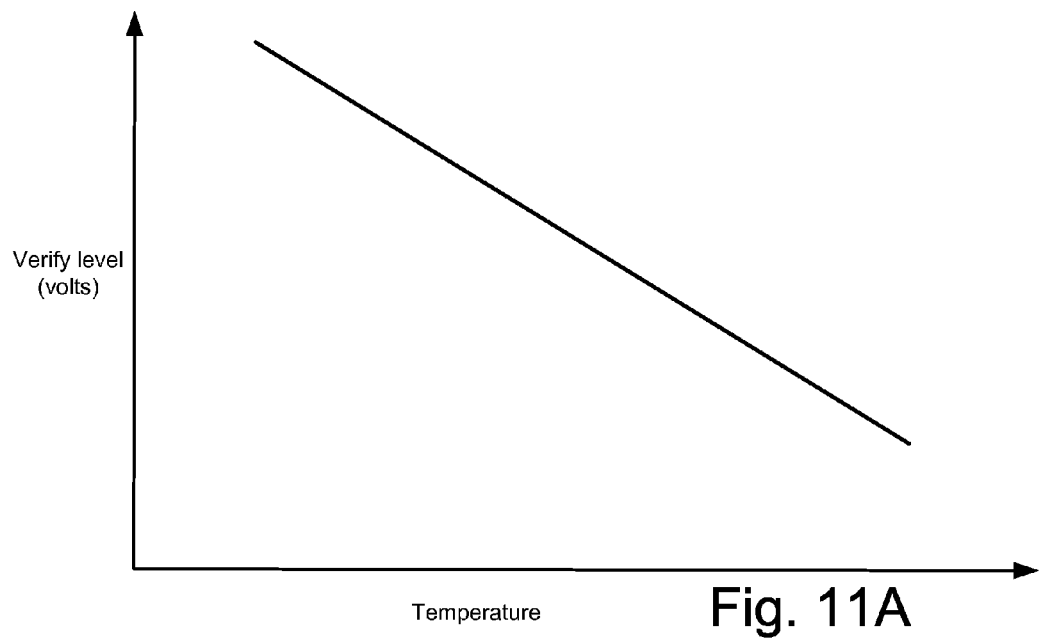
FIG. 11A is a graph of verify reference voltage versus program temperature for one embodiment.
Figure 11B:
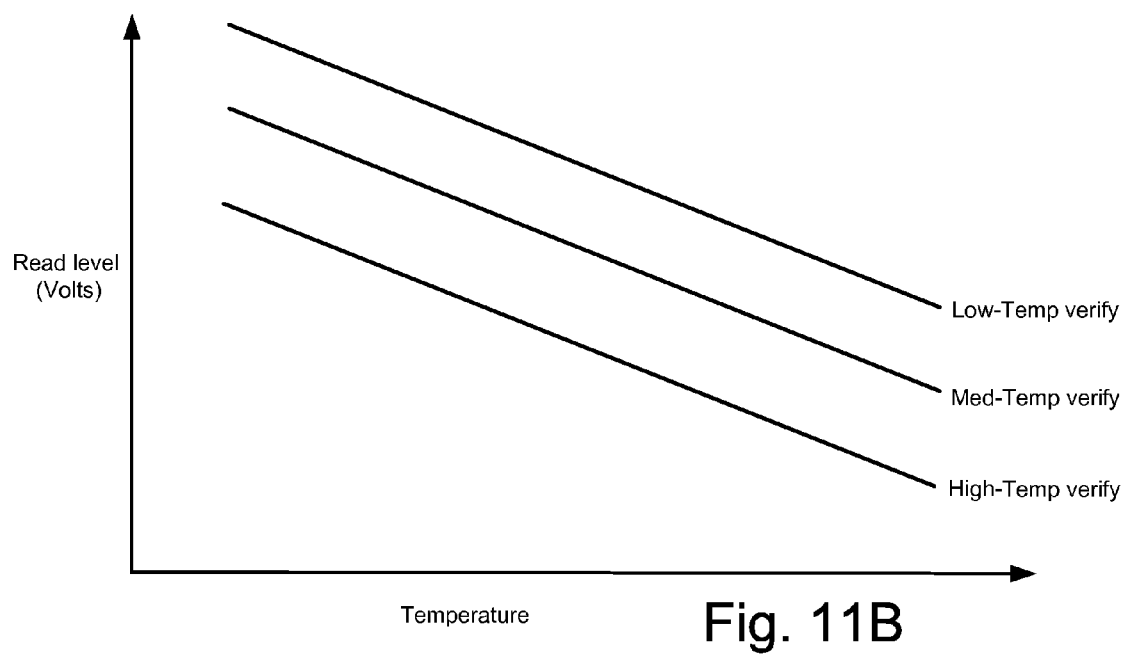
FIG. 11B is a graph a read reference voltage versus program temperature for one embodiment.

FIG. 11A is a graph of verify reference voltage versus program temperature for one embodiment. FIG. 11B is a graph of read reference voltage versus read temperature for one embodiment. Note that as the read reference voltage depends on program temperature, there may be a multitude of curves. Three curves are depicted (low-, medium-, and high-program verify temperature cases). In one embodiment, the slope of the curves for the read reference voltage is less (in absolute magnitude) than for the verify reference voltage of the same state.

Figure 12A:
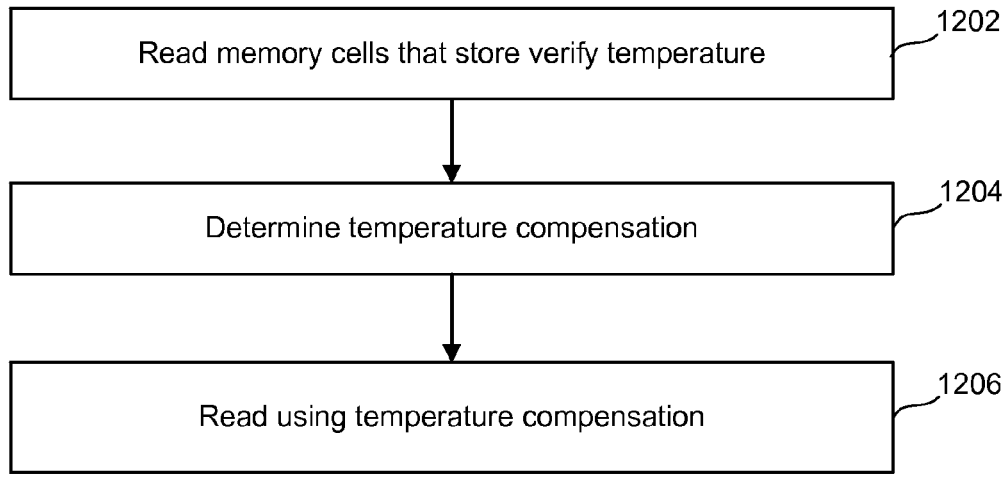
FIG. 12A is a flowchart of one embodiment of reading using compensation that depends on temperature at program verify.

FIG. 12A is a flowchart of one embodiment of reading using compensation that depends on temperature at program verify. This is one embodiment of step 806. In this embodiment, compensation that depends on the temperature at program verify could be used when reading all states, but this is not a requirement. In this embodiment, some extra memory cells are used to store an indication of the temperature at program verify. Such extra memory cells may be present on all word lines, but are not used to store user data. In one embodiment, the temperature information is stored as binary data. In one embodiment, redundant copies of the temperature information are stored.

This process may be used to read memory cells on a selected word line. In step 1202, the selected word line is read using a reference voltage that is suitable to read binary data. The data from the memory cells that store the temperature information is noted. In one embodiment, the temperature information is sent to control circuitry 220 such as the state machine 222. Thus, the temperature information could be stored in a temporary register in the state machine 222. In one embodiment, the temperature information is sent to the controller 244. The temperature information could be sent to other logic.

In one embodiment, several copies of the temperature information are read from the selected word line. These copies may be compared to determine whether they match. In one embodiment, as long as two of three copies match, the matching information is used. If all three copies are different, the temperature information could be ignored. In this case, compensation based on program verify temperature may be skipped. More or fewer than three copies could be used.

Any number of bits may be used to store the temperature information, depending on the desired granularity and temperature range. As one example, −30 C to 85 C could be used as the operating range, which means a 115 C temp range. To save temperature with 5 C resolution would need 5 bits. To save 2.5 C resolution would need 6 bits. As noted, two or three copies of these bits could to be programmed on the WL.

Also, note that the temperature information is not required to be a value that directly represents a temperature. For example, the temperature information might be a value that represents a reference current or reference voltage that was generated by, for example, temperature dependent circuit 229.

In step 1204, compensation based, at least in part, on the temperature at program verify is determined for reading at least one state. Note that "reading a state" as used herein refers to reading to determine whether memory cells have a Vth that is higher or lower than a reference voltage level associated with a state. As one example, a read reference level is determined based, at least in part, on the temperature at program verify. In one embodiment, Equation 3 is used. In one embodiment, the value for $Tco\_prog_2$ depends on the state. The read reference level may be determined either on chip (e.g., in control circuitry 220) or off chip (e.g., in controller 244). Note that step 1204 is not limited to determining read voltage levels to be applied to the selected word line. For example, step 1204 may determine how to modify a reference current that is used to sense memory cells. As another example, step 1204 may determine how to modify an integration time that is used to charge a sense capacitor used to sense memory cells.

In step 1206, reading is performing based on the temperature compensation. In one embodiment, the read reference voltage is applied to the selected word line is changed to provide the compensation. However, other techniques may be used to provide the temperature compensation. In one embodiment, the memory cells are read by comparing their conduction current to a sensing current. In one embodiment, the sensing current depends on the temperature during the verifying to provide the compensation. In one embodiment, the memory cells are read by sensing for a period of time. For example, a sense capacitor may be discharged (or charged) for some defined period of time. In one embodiment, the sensing time depends on the temperature during the verifying to provide the compensation. Step 1206 could include any combination of these techniques, or others.

Figure 12B:
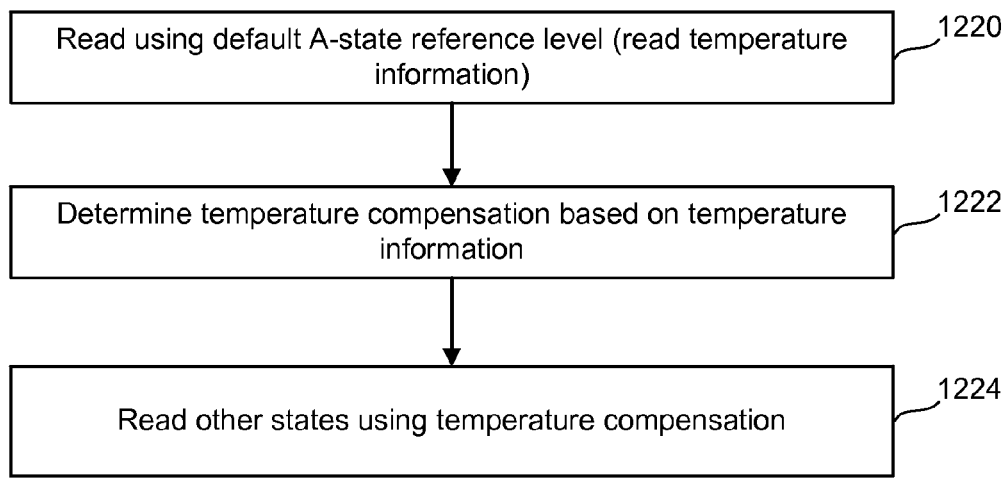
FIG. 12B is a flowchart of another embodiment of reading using compensation that depends on temperature at program verify.

FIG. 12B is a flowchart of one embodiment of reading using compensation that depends on temperature at program verify. This is one embodiment of step 806. In this embodiment, compensation that depends on the temperature at program verify is not used for the A-state. However, it may be used for reading other states. In step 1220, a read is performed using a default read reference level for the A-state. This read reference level may compensate based on the present temperature; however, it does not compensate based on the program verify temperature. Note that this read is able to read the program verify temperature information that is stored in the extra memory cells on the selected word line.

In step 1222, temperature compensation is determined for reading other states. For example, read reference levels are determined for VrB, VrC, VrD, etc. Step 1222 may be similar to step 1204 from FIG. 12A. In step 1224, reading for the other states is performed using temperature compensation that depends on the program verify temperature.

Figure 13:
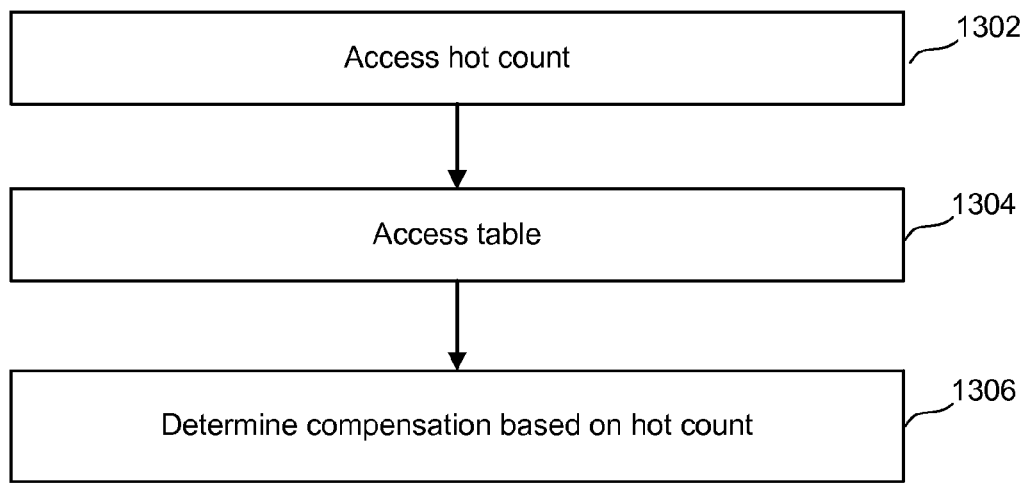
FIG. 13 is a flowchart of one embodiment of a determining temperature compensation based on hot count.

FIG. 13 is a flowchart of one embodiment of a determining temperature compensation based on hot count. This process may be used in conjunction with the read processes of FIG. 12A, 12B, but is not so limited. The process may also be used to determine compensation during program verify. In one embodiment, the Vth distribution widths can change with cycling (hot count). Thus, different values for $Tco\_prog_1$, $Tco\_prog_2$, as well as Tco may be used based on hot count in one embodiment.

In step 1302, a hot count is accessed. A hot count is the number of erase/write cycles for a block of memory cells, in one embodiment. The controller 244 may keep the hot count. In one embodiment, the hot count may be stored in extra memory cells in the block. In one embodiment, a different measure of erase/write cycles for a block may be used, such as the number of erase loops required to erase the block, or the average number of program loops required to program the WLs in the block. Such measures may also offer a good estimation of the number of erase/write cycles that the block has gone through.

In step 1304, a look up table for determining temperature compensation is accessed. In one embodiment, this table is based on Equation 3. However, another Equation could be used. As noted, different compensation may be used for different states. Thus, the lookup table may have separate entries for each state. In one embodiment, the controller 244 stores the table. However, the table could be stored elsewhere.

In step 1306, compensation that depends on the program verify temperature is determined. In this case, it is based on the hot count. As noted, a different measure of erase/write cycles for a block may be used, such as the number of erase loops required to erase the block, or the average number of program loops required to program the WLs in the block. This concludes discussion of FIG. 13.

It may be that the entire block is programmed completely at once. In fact, it could be that typically the entire block is programmed completely at once. Thus, the temperature of program may be the same for each WL in the block. In this case, the temperature information might be saved on a single WL (or if desired multiple WLs). Regardless, when reading that block the temperature information only needs to be read once. The temperature information could be stored in a temperature register in the state machine 222, or elsewhere. Thus, if the read includes reading multiple WLs in the same block, time can be saved. Also note that any calculations or lookup table processing only needs to performed once per block. Similar methodology may be used for sets of blocks that are programmed at once.

One embodiment includes a method of operating non-volatile storage while providing for compensation that depends on the temperature at which the program verify was performed. The method includes verifying one or more program operations of a group of non-volatile storage elements in the non-volatile storage; storing an indication of temperature at which the verifying was performed; and later reading the group of non-volatile storage elements using compensation that depends on the temperature at which the verifying was performed.

One embodiment includes a non-volatile storage device comprising a plurality of non-volatile storage elements, a plurality of word lines, and one or more management circuits in communication with the plurality of non-volatile storage elements and the plurality of word lines. A first of the word lines is associated with a group of the plurality of non-volatile storage elements. The one or more management circuits verify one or more program operations of the group of non-volatile storage elements. The one or more management circuits store an indication of temperature at which the verify was performed. The one or more management circuits read the group of non-volatile storage elements using compensation that depends on the temperature at which the verify was performed.

One embodiment includes a method of operating non-volatile storage while providing temperature compensation during read that depends on the verify temperature. A group of non-volatile storage elements are programmed. The programming include performing one or more verify operations using compensation that is based on the equation: $Tco\_prog_1*Tprog+Tco*Tprog$, where Tprog is the temperature during program verify, Tco compensates for Vth temperature dependence of the group of non-volatile storage elements and $Tco\_prog_1$ compresses the width of a Vth distribution window of the programmed group of non-volatile storage elements with increasing temperature. An indication of the temperature at which the verifying was performed is stored. Later, the group of non-volatile storage elements are read using compensation that is based on the equation: $Tco\_prog_2*Tprog+Tco*Tread$, where Tread is the temperature during read and $Tco\_prog_2$ adjusts the read levels to compensate for an effect caused by $Tco\_prog_1$ during program verify.

One embodiment includes a non-volatile storage device comprising a plurality of non-volatile storage elements, a plurality of word lines, and one or more management circuits in communication with the plurality of non-volatile storage elements and the plurality of word lines. A first of the word lines is associated with a group of the plurality of non-volatile storage elements. The one or more management circuits program the group of non-volatile storage elements. The one or more management circuits perform one or more verify operations during the programming using verify reference voltages that are based on the equation: $Tco\_prog_1*Tprog+Tco*Tprog$, where Tprog is the temperature during program verify, Tco compensates for Vth temperature dependence of the group of non-volatile storage elements and Tcoprogl reduces gaps between states of the programmed group of non-volatile storage elements with increasing temperature. The one or more management circuits store an indication of temperature at which the verifying was performed. The one or more management circuits read the group of non-volatile storage elements using compensation that is based on the equation: $Tco\_prog_2*Tprog+Tco*Tread$, where Tread is the temperature during read and $Tco\_prog_2$ adjusts read reference voltages to compensate for an effect to the width of the threshold voltage distribution window caused by Tcoprogl during program verify.

One embodiment includes a method of operating non-volatile storage, comprising: programming a group of non-volatile storage elements to a plurality of data states at a first temperature, the programming includes verifying the plurality of data states using a first set of verify levels; and programming the group of non-volatile storage elements to the plurality of data states at a second temperature, the programming includes verifying the plurality of data states using a second set of verify levels, the first set and the second set of verify levels compensate for temperature dependence of individual threshold distribution widths of the plurality of data states.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical applications, to thereby enable others skilled in the art to best utilize various embodiments and with various modifications as are suited to the particular use contemplated. It is intended that the scope be defined by the claims appended hereto.

I claim:

1. A method of operating non-volatile storage, comprising:
   verifying one or more program operations of a group of non-volatile storage elements in the non-volatile storage;
   storing an indication of temperature at which the verifying was performed; and
   reading the group of non-volatile storage elements using compensation that depends on the temperature at which the verifying was performed, including applying compensation that is independent of temperature dependence of the non-volatile storage elements threshold voltages.

2. A method of operating non-volatile storage, comprising:
   verifying one or more program operations of a group of non-volatile storage elements in the non-volatile storage, including applying different amounts of compensation to verify respective different states of a plurality of states to which the group of non-volatile storage elements are programmed, the different amounts of compensation shift a first verify level for a higher state more than a second verify level for a lower state, with increasing verify temperature;
   storing an indication of temperature at which the verifying was performed; and
   reading the group of non-volatile storage elements using compensation that depends on the temperature at which the verifying was performed.

3. The method of claim 2, wherein the different amounts of compensation depend at least in part on temperature dependence of threshold voltage distribution widths of the respective different states.

4. The method of claim 2, wherein the reading the group of non-volatile storage elements using compensation that depends on the temperature at which the verifying was performed includes:
   applying different amounts of compensation for reading different states of the plurality of states, the different amounts of compensation shift down a first read level for the higher state more than a second read level for the lower state, with increasing temperature at which the verifying was performed.

5. A method of operating non-volatile storage, comprising:
   verifying one or more program operations of a group of non-volatile storage elements in the non-volatile storage, including—applying one or more first compensations for temperature dependence of the group of non-volatile storage elements threshold voltage and one or more second compensations that are independent of temperature dependence of the group of non-volatile storage elements threshold voltage;
   storing an indication of temperature at which the verifying was performed; and
   reading the group of non-volatile storage elements using compensation that depends on the temperature at which the verifying was performed.

6. The method of claim 5, wherein there are gaps between threshold voltage distributions that represent adjacent states of a plurality of states to which the group is programmed, the one or more second compensations decrease at least one of the gaps with increasing temperature.

7. The method of claim 5, wherein the reading the group of non-volatile storage elements using compensation that depends on the temperature at which the verifying was performed includes:
   applying one or more third compensations that adjust read levels to compensate for shifts caused by the second one or more compensations.

8. The method of claim 1, wherein the reading the group of non-volatile storage elements using compensation that depends on the temperature at which the verifying was performed includes one or more of:
   reading with a sensing current that depends on the temperature during the verifying;
   reading with a sensing time that depends on the temperature during the verifying; or
   applying a voltage to a selected word line that depends on the temperature during the verifying.

9. A non-volatile storage device comprising:
   a plurality of non-volatile storage elements;
   a plurality of word lines, a first of the word lines is associated with a group of the plurality of non-volatile storage elements;
   one or more management circuits in communication with the plurality of non-volatile storage elements and the plurality of word lines, the one or more management circuits verify one or more program operations of the group of non-volatile storage elements, the one or more management circuits store an indication of temperature at which the verify was performed, the one or more management circuits read the group of non-volatile storage elements using compensation that depends on the temperature at which the verify was performed, wherein the compensation that depends on the temperature at which the verify was performed compensates for temperature dependence of threshold voltage distribution widths of the non-volatile storage elements threshold voltages.

10. A non-volatile storage device comprising:
    a plurality of non-volatile storage elements;
    a plurality of word lines, a first of the word lines is associated with a group of the plurality of non-volatile storage elements;
    one or more management circuits in communication with the plurality of non-volatile storage elements and the plurality of word lines, the one or more management circuits verify one or more program operations of the group of non-volatile storage elements, the one or more management circuits apply different amounts of compensation to verify respective different states of a plurality of states to which the group of non-volatile storage elements are programmed, the different amounts of compensation shift a first verify level for a higher state more than a second verify level for a lower state, with increasing verify temperature, the one or more management circuits store an indication of temperature at which the verify was performed, the one or more management circuits read the group of non-volatile storage elements using compensation that depends on the temperature at which the verify was performed.

11. The non-volatile storage device of claim 10, wherein the different amounts of compensation depend on threshold voltage distribution widths of the respective different states.

12. The non-volatile storage device of claim 10, wherein there are gaps between threshold voltage distributions that represent adjacent states of a plurality of states to which the group is programmed, the different amounts of compensation decrease at least one of the gaps with increasing temperature.

13. A method of operating non-volatile storage, comprising:
 programming a group of non-volatile storage elements, the programming including performing one or more verify operations using compensation that is based on the equation:

$$Tco\_prog1*Tprog+Tco*Tprog,$$

where Tprog is the temperature during program verify, Tco compensates for Vth temperature dependence of the group of non-volatile storage elements and Tco_prog1 compresses a width of a Vth distribution window of the programmed group of non-volatile storage elements with increasing temperature;
 storing an indication of temperature at which the verifying was performed; and
 reading the group of non-volatile storage elements using compensation that is based on the equation:

$$Tco\_prog2*Tprog+Tco*Tread,$$

where Tread is the temperature during read and Tco_prog2 adjusts read levels to compensate for an effect caused by Tco_prog1 during program verify.

14. The method of claim 13, wherein the storing an indication of temperature at which the verifying was performed includes:
 writing the indication to a word line that includes the group of non-volatile storage elements.

15. The method of claim 13, further comprising:
 reading the indication from a selected word line when reading the group of non-volatile storage elements at a first reference level without applying compensation based on the temperature at which the verifying was performed.

16. The method of claim 13, wherein values for Tco_prog1 and Tco_prog2 are based on an erase/program cycle count for a block containing the group of non-volatile storage elements.

17. The method of claim 13, wherein the storing an indication of temperature at which the verifying was performed includes storing the indication in spare non-volatile storage elements associated with a first word line in a block, the indication of the temperature is used when reading other word lines in the block that were verified at about the same temperature.

18. A non-volatile storage device comprising:
 a plurality of non-volatile storage elements;
 a plurality of word lines, a first of the word lines is associated with a group of the plurality of non-volatile storage elements;
 one or more management circuits in communication with the plurality of non-volatile storage elements and the plurality of word lines, the one or more management circuits program the group of non-volatile storage elements, the one or more management circuits perform one or more verify operations during the programming using verify reference voltages that are based on the equation: Tco_prog1*Tprog+Tco*Tprog, where Tprog is the temperature during program verify, Tco compensates for Vth temperature dependence of the group of non-volatile storage elements and Tco_prog1 reduces gaps between states of the programmed group of non-volatile storage elements with increasing temperature, the one or more management circuits store an indication of temperature at which the verifying was performed, the one or more management circuits read the group of non-volatile storage elements using compensation that is based on the equation: Tco_prog2*Tprog+ Tco*Tread, where Tread is the temperature during read and Tco_prog2 adjusts read reference voltages to compensate for an effect to the width of the threshold voltage distribution window caused by Tco_prog1 during program verify.

19. A method of operating non-volatile storage, comprising:
 programming a group of non-volatile storage elements to a plurality of data states at a first temperature, the programming includes verifying the plurality of data states using a first set of verify levels; and
 programming the group of non-volatile storage elements to the plurality of data states at a second temperature, the programming includes verifying the plurality of data states using a second set of verify levels, the first set and the second set of verify levels compensate for temperature dependence of individual threshold distribution widths of the plurality of data states.

20. The method of claim 19, further comprising:
 reading the group of non-volatile storage elements using compensation that depends on the temperature at which the group of non-volatile storage elements were programmed.

21. The method of claim 19, wherein the first set of verify levels has a first difference between verify levels for two adjacent states, the second set of verify levels has a second difference between verify levels for the two adjacent states that is less than the first difference, the second temperature is higher than the first temperature.

22. The method of claim 21, further comprising:
 applying compensation for temperature dependence of threshold voltages of the group of non-volatile storage elements when verifying and reading the two adjacent states.

\* \* \* \* \*